United States Patent
Hadley et al.

(10) Patent No.: US 7,172,910 B2
(45) Date of Patent: Feb. 6, 2007

(54) WEB FABRICATION OF DEVICES

(75) Inventors: Mark A. Hadley, Newark, CA (US); Ann Chiang, Cupertino, CA (US); Gordon S. W. Craig, Palo Alto, CA (US); Jeffrey Jay Jacobsen, Hollister, CA (US); John Stephen Smith, Berkeley, CA (US); Jay Tu, Oakland, CA (US); Roger Green Stewart, Morgan Hill, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 11/169,534

(22) Filed: Jun. 28, 2005

(65) Prior Publication Data

US 2005/0255620 A1 Nov. 17, 2005

Related U.S. Application Data

(60) Continuation of application No. 10/611,142, filed on Jun. 30, 2003, now Pat. No. 6,927,085, which is a division of application No. 09/932,409, filed on Aug. 17, 2001, now Pat. No. 6,683,663, which is a continuation-in-part of application No. 09/270,146, filed on Mar. 16, 1999, now abandoned.

(51) Int. Cl.
*H01L 21/00* (2006.01)
(52) U.S. Cl. .................. 438/28; 438/56; 257/E21.5; 257/E21.55

(58) Field of Classification Search ............ 438/28, 438/15, 56, 75, 73; 257/E21.5, E21.553, 257/E21.705
See application file for complete search history.

(56) References Cited

U.S. PATENT DOCUMENTS

| 3,439,416 | A | * | 4/1969 | Yando | .................. 29/625 |
| 4,191,800 | A | | 3/1980 | Holtzman | |
| 4,514,583 | A | | 4/1985 | Izu et al. | |

(Continued)

FOREIGN PATENT DOCUMENTS

EP 0 747 948 12/1996

(Continued)

OTHER PUBLICATIONS

Nakamura, Eiji, et al.; 37.3: Development Of Electrophoretic Display Using Microcapsulated Suspension; SID International Symposiuim Digest Of Technical Papers, US, Santa Ana, CA.; SID vol. 29, 1998; pp. 1014-1017.

(Continued)

*Primary Examiner*—Caridad Everhart
(74) *Attorney, Agent, or Firm*—Blakely, Sokoloff, Taylor & Zafman LLP

(57) ABSTRACT

Apparatuses and methods for forming displays are claimed. One embodiment of the invention relates to forming an assembly using different sized blocks in either a flexible or rigid substrate.

23 Claims, 32 Drawing Sheets

U.S. PATENT DOCUMENTS

| | | | | |
|---|---|---|---|---|
| 4,966,442 A * | 10/1990 | Ono et al. | ............... | 350/339 R |
| 5,034,802 A | 7/1991 | Liebes, Jr. et al. | | |
| 5,436,744 A * | 7/1995 | Arledge et al. | ............... | 359/82 |
| 5,453,864 A * | 9/1995 | Yamada et al. | ............. | 359/103 |
| 5,545,291 A * | 8/1996 | Smith et al. | ............. | 156/655.1 |
| 5,904,545 A | 5/1999 | Smith et al. | | |
| 5,964,397 A * | 10/1999 | Dautartas | ............... | 228/180.22 |
| 6,091,332 A | 7/2000 | Eberhardt et al. | | |
| 6,094,138 A | 7/2000 | Eberhardt et al. | | |
| 6,133,633 A * | 10/2000 | Berger et al. | ............... | 257/737 |
| 6,246,327 B1 | 6/2001 | Eberhardt | | |
| 6,274,508 B1 | 8/2001 | Jacobsen et al. | | |
| 6,281,038 B1 | 8/2001 | Jacobsen et al. | | |
| 6,316,278 B1 | 11/2001 | Jacobsen et al. | | |
| 6,426,564 B1 * | 7/2002 | Ball | ........................... | 257/783 |
| 6,468,638 B2 | 10/2002 | Jacobsen et al. | | |
| 6,507,989 B1 * | 1/2003 | Bowden et al. | ............ | 29/592.1 |
| 6,514,618 B1 * | 2/2003 | McKeighen | ................. | 428/413 |
| 2001/0031514 A1 | 10/2001 | Smith | | |

FOREIGN PATENT DOCUMENTS

WO     WO 99/67678     12/1999

OTHER PUBLICATIONS

Wu, C.C.; Integration of Organic LED's and Amorphous Si TFT's onto Flexible and Lightweight Metal Foil Substrates; IEEE Electron Device Letters, US, IEEE, Inc., New York; vol. 18, No. 12, Dec. 1, 1997; pp. 609-612.

Search Report for PCT/US 99/30391 mailed May 23, 2000; 5 pages.

\* cited by examiner

TOP LAYER

BOTTOM LAYER

US 7,172,910 B2

WEB FABRICATION OF DEVICES

CROSS-REFERENCE TO RELATED APPLICATION

This application is a continuation application of U.S. patent application No. 10/611,142, filed on Jun. 30, 2003 now U.S. Pat. No. 6,927,085, which is a divisional application of U.S. patent application Ser. No. 09/932,409, filed on Aug. 17, 2001, now issued as U.S. Pat. No. 6,683,663, which is a Continuation-In-Part of application Ser. No. 09/270,146 filed Mar. 16, 1999 by applicant Jeffrey Jay Jacobsen, entitled "Apparatuses and Methods for Forming Assemblies," now abandoned.

This application claims the benefit of the earlier filing date of provisional application of Jeffrey Jay Jacobsen entitled, "*Apparatuses and Methods for Forming Assemblies*," Ser. No. 60/118,887, filed Feb. 5, 1999 and incorporated herein by reference.

FIELD OF THE INVENTION

The present invention relates generally to the field of fabricating electronic assemblies such as display panels.

DESCRIPTION OF RELATED ART

Electronic assemblies such as display panels. Display panels may be comprised of active matrix or passive matrix panels are widely used. Active matrix panels and passive matrix panels may be either transmissive or reflective. Transmissive displays include polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs), up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays (LCDs) may have an active-matrix backplane in which thin-film transistors are co-located with LCD pixels. Flat-panel displays employing LCDs generally include five different components or layers: a White or sequential Red, Green, Blue light source, a first polarizing filter, that is mounted on one side of a circuit panel on which the TFTs are arrayed to form pixels, a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers.

LCDs may also have a passive matrix backplane. A passive matrix backplane typically includes two planes of strip electrodes that sandwich the liquid crystal material. However, passive matrices generally provide a lower quality display compared to active matrices. Liquid crystal material includes, but is not limited to, twisted nematic (TN), Super TN, double STN, and ferroelectric. U/DCP and EP displays are formed in a similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix allows the use of higher frequency AC excitation in order to obtain brighter electroluminescence in the pixel phosphor LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. The backplane forms the electrical interconnection of the display and typically comprises electrodes, capacitors, and transistors in at least some embodiments of a backplane.

FIGS. 1A–1D illustrate a variety of displays that formed on a rigid substrate are known in the art. FIG. 1A illustrates a rigid display device in which the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self assembly; an example of this process is described in U.S. Pat. No. 5,545,291. These blocks may each contain driver circuitry (e.g., MOSFET and capacitor) for driving a pixel electrode. The active matrix backplane includes transparent pixel electrodes and row/column interconnects (not shown) to electrically interconnect blocks 14. Plurality of blocks 14 are coupled to active matrix display backplane 10 and rigid substrate 12. FIG. 1C illustrates reflective display 16 coupled to rigid substrate 12. FIG. 1D illustrates a reflective display 16 coupled to rigid substrate 12. Plurality of blocks 14 is coupled to reflective display 16 and to rigid substrate 12.

Given the brief description of some electronic assemblies such as displays, the discussion now turns to the placement of elements onto rigid substrate 12. Placing elements, such as pixel drivers, on a rigid substrate is well known. Prior techniques may be generally divided into two types: deterministic methods or random methods. Deterministic methods, such as "pick and place", use a human or an arm of a robot to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly (FSA). Using this technique, various blocks, each containing a functional component, may be fabricated on one substrate and then separated from that substrate and assembled onto a separate rigid substrate through FSA. The blocks that are deposited onto receptor regions of a substrate may include any of a number of different functional components, such as LEDs, pixel drivers, sensors, etc. An example of a particular type of block and its functional component is described in co-pending U.S. patent application Ser. No. 09/251,220 entitled "Functionally Symmetric Integrated Circuit Die" which was filed Feb. 16, 1999 by the inventor John Stephen Smith. This application is hereby incorporated herein by reference.

As noted above, FIGS. 1B and 1D illustrate substrate 12 with blocks 14 formed in rigid substrate 12. Blocks 14 may be deposited through an FSA process. In the FSA process, a slurry containing blocks 14 is deposited over the rigid substrate 12 and blocks 14 rest in corresponding openings in substrate 12.

FIG. 2 illustrates a cross-sectional view of block 14 and circuit element 18 on the top surface of block 14. Generally, blocks 14 have a trapezoidal cross-section where the top of block 14 is wider than the bottom of block 14.

FIG. 3 illustrates a cross-sectional view of blocks 14 in recessed regions of rigid substrate 12. Between block 14 and rigid substrate 12 is eutetic layer 13.

FIG. 4 illustrates a cross-sectional view of rigid substrate 12 coupled to a rigid display backplane 30 with plurality of blocks 14 between rigid display backplane 30 and substrate 12. Plurality of blocks 14 are functionally part of display backplane 30 and are deposited onto receptor regions of substrate 12. Each block 14 drives at least one transparent pixel electrode. The electrode pixel is fabricated over a transistor that is fabricated in block 14.

FIG. 5 illustrates a top view of a portion of an array in an active matrix display backplane. Control line rows 31 and 32 in this device are coupled to gate electrodes along row and control line columns 34 and 35 are coupled to data drivers that supply pixel voltages that are applied to the pixel electrodes. Column line 34 is connected to a source electrode of field effect transistor (FET) 36. Another column line 35 is coupled to a source electrode of FET 37. Row line 32 is coupled to the gates of both FETs 36 and 37. The drain of FET 36 is coupled through capacitor 38 to a transparent pixel electrode along row 32 formed by FETs 36 and 37, and the drain of FET 37 is coupled through a capacitor to another pixel electrode along the row. In one typical example, the backplane may be formed by depositing blocks, using an FSA technique, into a rigid substrate (e.g., glass); each block contains a FET and a capacitor and is interconnected to other blocks by column and row conductors that are deposited onto the rigid substrate; and, the capacitor is coupled to a pixel electrode by another conductor that is deposited onto the rigid substrate. The active medium (e.g., a liquid crystal) is deposited at least on the pixel electrodes that will optically change the active medium's properties in response to the combined voltages or currents produced by the pixel electrodes. The active medium at a given pixel electrode 42 typically appears as a square or dot in the overall checkerboard type matrix of the display. The actual size of the FETs and the pixel electrodes 42 are not now drawn to scale, but are shown schematically for the purposes of illustration. FIG. 6 illustrates a top view of pixel electrodes 46 on top of a substrate 48.

There are several disadvantages inherent to the related art. Rigid flat-panel displays are limited in that they are generally coupled to rigid objects. Pressure applied to flexible objects that may be coupled to rigid objects may cause too much stress on rigid flat-panel displays that could affect the electrical interconnections in rigid flat-panel displays.

Another disadvantage to these flat-panel displays is that they are manufactured in a batch operation. Batch operations inherently involve a certain amount of down lost in production. This increases production time to fabricate display panels. Additionally, flat-panel displays are generally fabricated on rigid substrates that are not continuous in length. This also decreases productivity since the assembly of the flat-panel displays is interrupted until another substrate panel is available to assemble the flat-panel display.

SUMMARY

One aspect of the invention involves creating an electronic assembly such as a display using different sizes of blocks that may include functional components in flexible or rigid substrates.

A method for fabricating an assembly, comprising dispensing a first slurry over a substrate, said first slurry containing a plurality of first objects, and dispensing a second slurry over a substrate, said second slurry containing a plurality of second objects which are different in shape from said first shaped object, in which said first plurality of objects and said second plurality of objects are deposited onto said substrate.

Another aspect of the invention relates to a transfer tool having at least one transfer member for transferring more than one block from a first substrate to a second substrate.

While an array of components (e.g., display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The present invention is illustrated by way of example. The invention is not limited to the figures of the accompanying drawings in which like references indicate similar elements.

DETAILED DESCRIPTION

The present invention relates to apparatuses and methods for forming electronic assemblies such as displays.

In one aspect of the invention, fluidic self-assembly (FSA) in conjunction with a deterministic method of placing blocks (e.g., "pick and place") with circuit elements of objects onto a rigid substrate or a web process material is disclosed. In this aspect of the invention, the recessed regions of the substrate are checked for empty regions after, for example, FSA has been implemented. If there are one or more empty recessed regions in the substrate, then one or more objects are robotically placed into the empty recessed regions. By robotically placing objects into empty recessed regions of a substrate, the overall overall effectiveness and the quality of the display is improved. Additionally, production time is decreased by robotically placing at the same time more than one block into recessed regions in a substrate.

In the following description, numerous specific details such as specific materials, processing parameters, processing steps, etc., are set forth in order to provide a thorough understanding of the invention. One skilled in the art will recognize that these details need not be specifically adhered to in order to practice the claimed invention. In other instances, well known processing steps, materials, etc. are not set forth in order not to obscure the invention.

Figure 1A:
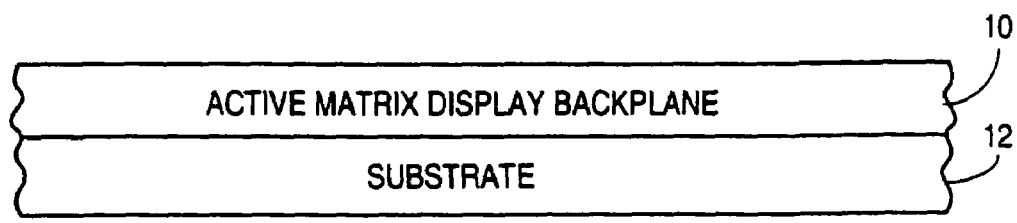
FIG. 1A illustrates a cross-sectional view of an active matrix display backplane coupled to a rigid substrate of the prior art.
Figure 1B:
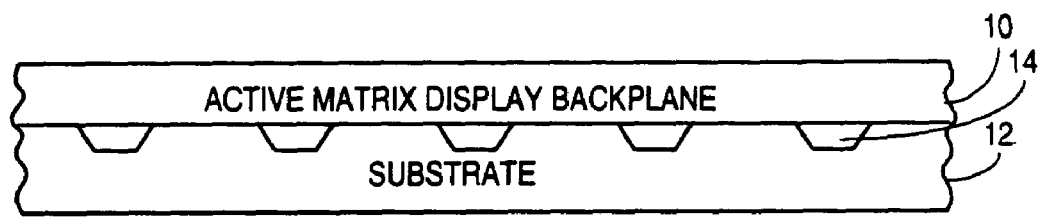
FIG. 1B illustrates a cross-sectional view of an active matrix display backplane coupled to a rigid substrate in which a plurality of blocks are part of the active matrix display of the prior art.
Figure 1C:
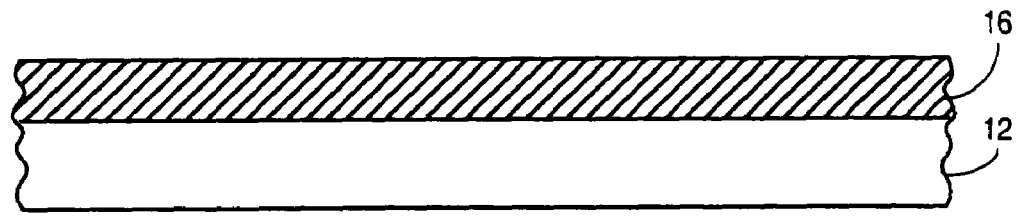
FIG. 1C illustrates a cross-sectional view of a reflective display backplane coupled to a rigid substrate of the prior art.
Figure 1D:
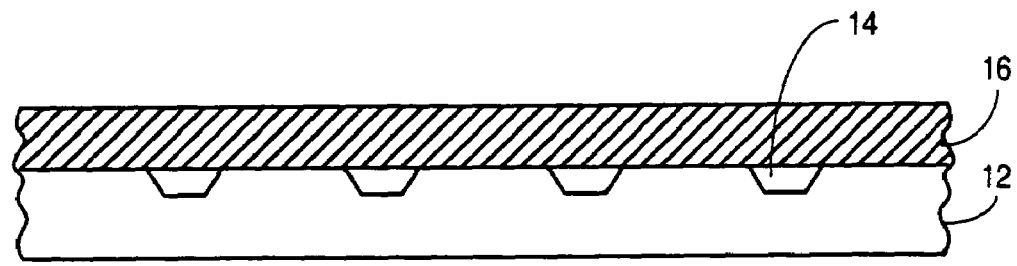
FIG. 1D illustrates a cross-sectional view of a reflective display backplane coupled to a rigid substrate in which a plurality of blocks are coupled to the reflective display and to the rigid substrate of the prior art.
Figure 2:
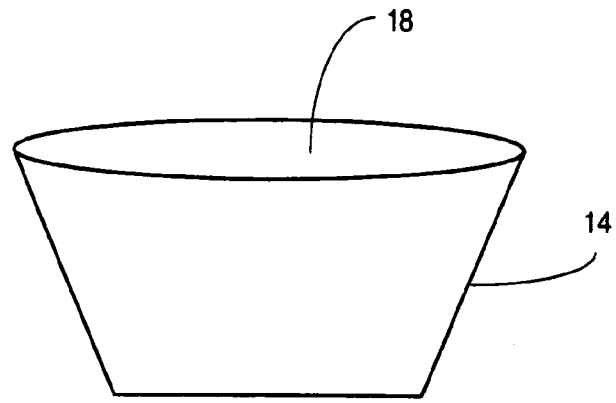
FIG. 2 illustrates a cross-sectional view of a circuit element block of the prior art.
Figure 3:
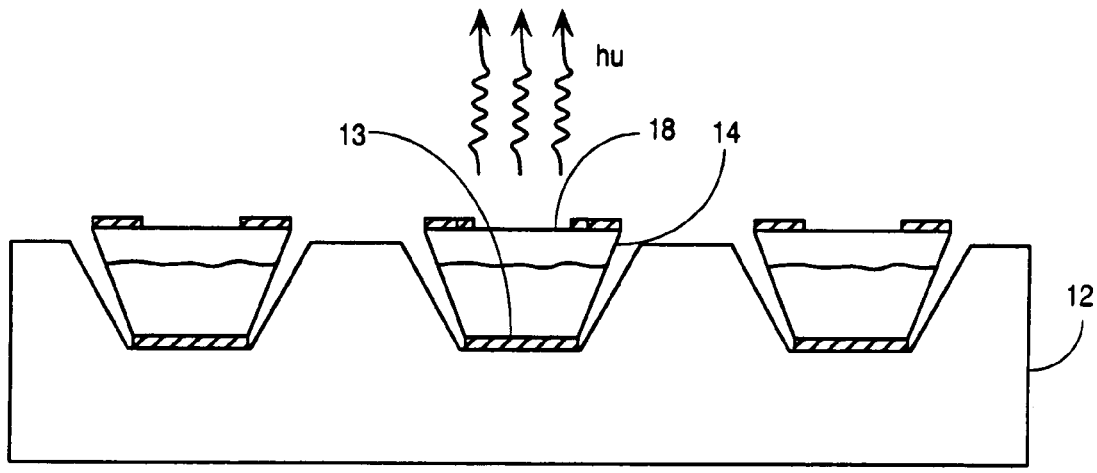
FIG. 3 illustrates a cross-sectional view of blocks in recessed regions of the rigid substrate and a metalization surface on the blocks of the prior art.
Figure 4:
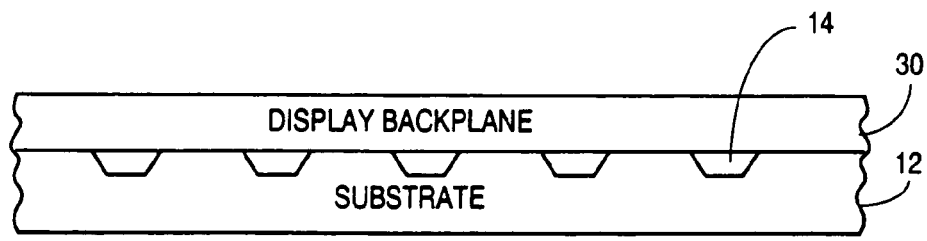
FIG. 4 illustrates a cross-sectional view of a rigid substrate coupled to a rigid display backplane with a plurality of blocks between the display backplane and substrate of the prior art.
Figure 5:
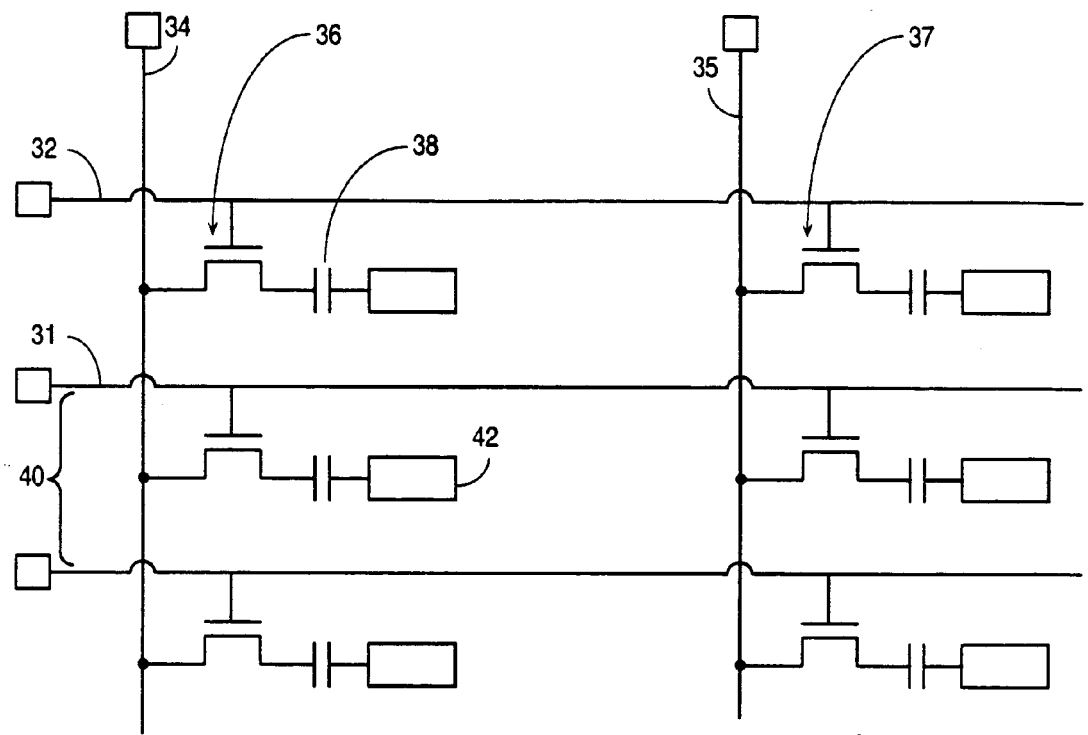
FIG. 5 illustrates a top schematic view of a portion of an array of an active matrix backplane of the prior art.
Figure 6:
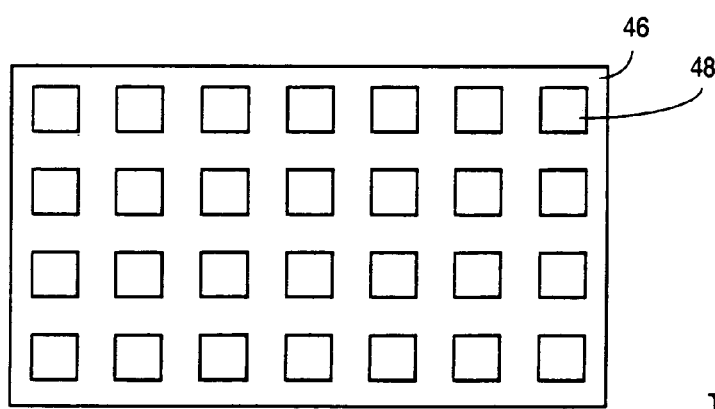
FIG. 6 illustrates a schematic view of a plurality of pixel electrodes in a backplane in accordance with one embodiment of the invention.
Figure 7A:
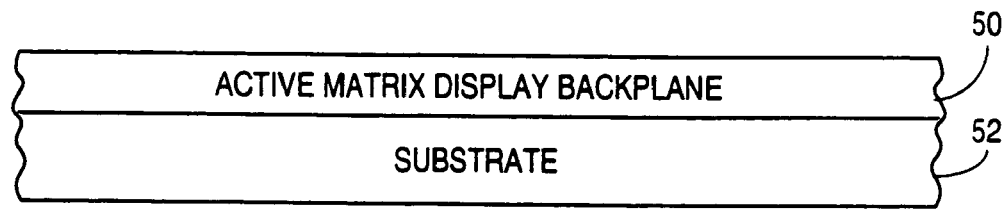
FIG. 7A illustrates a cross-sectional view of a flexible display device in which an active matrix display backplane is coupled to a flexible substrate in accordance with one embodiment of the invention.
Figure 7B:
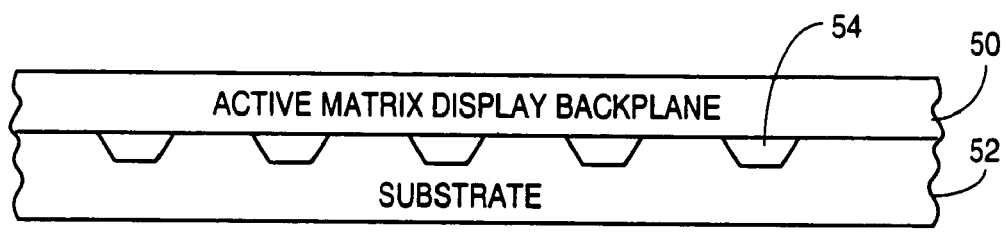
FIG. 7B illustrates a cross-sectional view of a flexible display device in which an active matrix display backplane is formed on a flexible substrate in accordance with one embodiment of the invention.
Figure 7C:
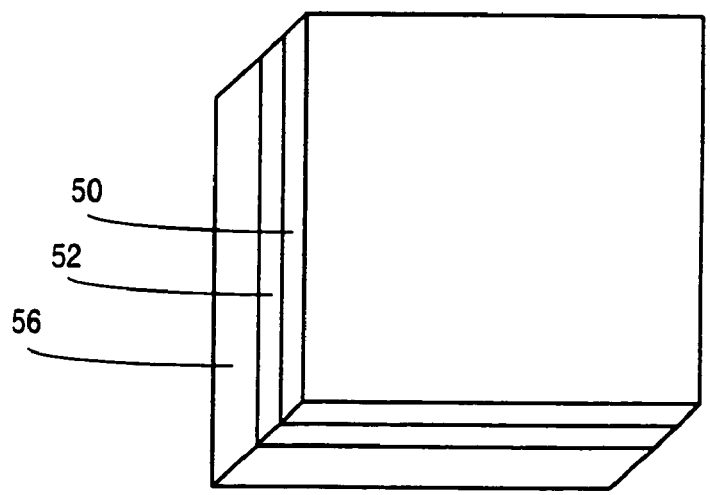
FIG. 7C illustrates a top view of a flexible display device comprising an active matrix display backplane coupled to a flexible substrate in which the flexible display device is coupled to an object in accordance with one embodiment of the invention.

FIG. 7A shows a flexible display device, one embodiment of the invention. Here, an active matrix display backplane 50 is coupled to a flexible substrate 52. The active matrix may include pixel electrodes and spatial light modulators. FIG. 7B illustrates a flexible display device in which active matrix display backplane 50 is coupled to flexible substrate 52. Bistable crystal may be used in conjunction with the flexible substrate 52. A display of this type may be used in credit cards or some other type of card that has flexibility. Blocks 54 are deposited onto the flexible substrate and are part of the active matrix display backplane. Block 54 comprises an active circuit element (not shown) that drives a picture element (not shown). FIG. 7C illustrates the top view of a flexible display device in which an active matrix display backplane 50 is coupled to a flexible substrate 52. The flexible display device conforms to the shape of the object 56 and is coupled to an object 56.

Figure 8A:
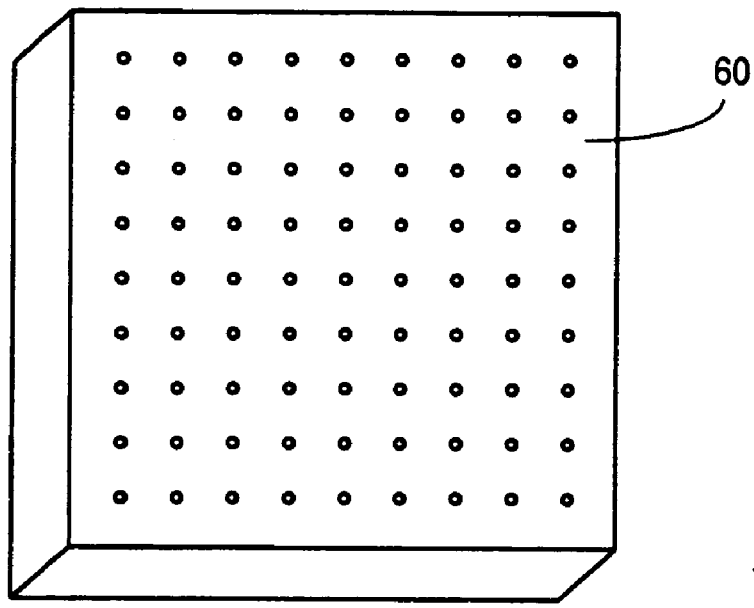
FIG. 8A illustrates a top view of an active matrix display backplane in accordance with one embodiment of the invention.
Figure 8B:
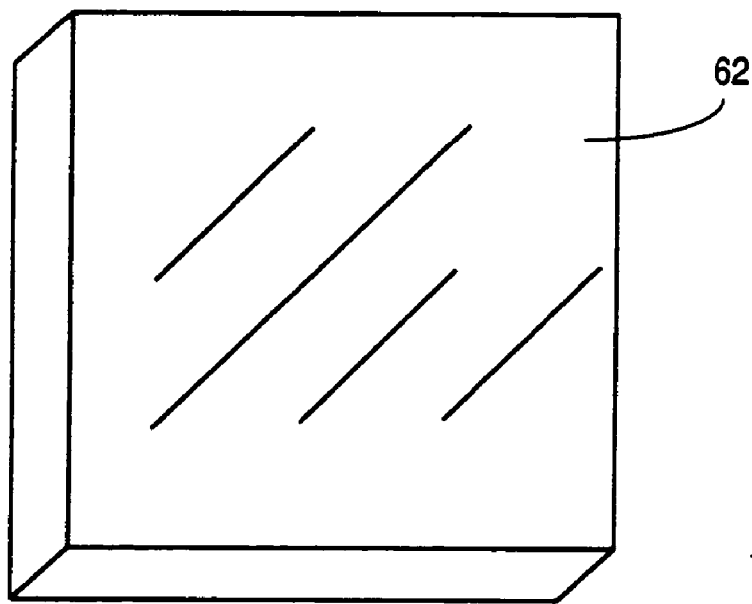
FIG. 8B illustrates a top view of a passive matrix display backplane in accordance with one embodiment of the invention.
Figure 8C:
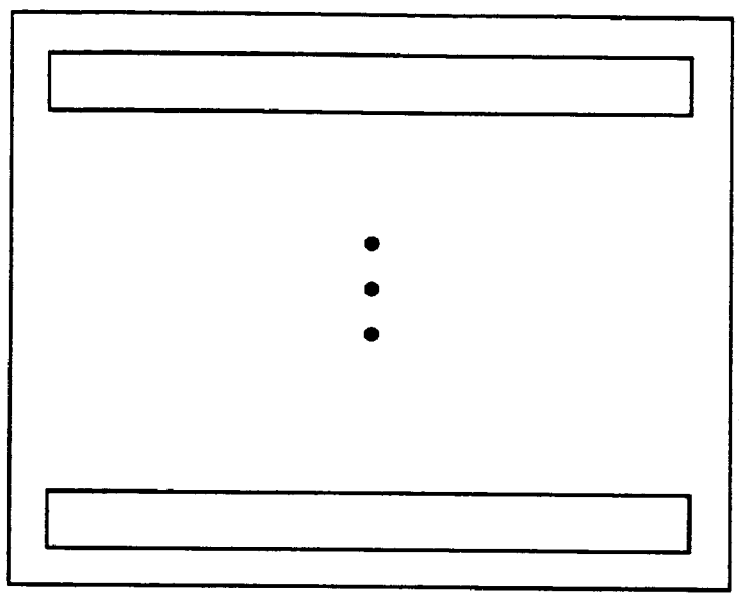
FIG. 8C illustrates a top layer of a passive matrix display backplane in accordance with one embodiment of the invention.
Figure 8D:
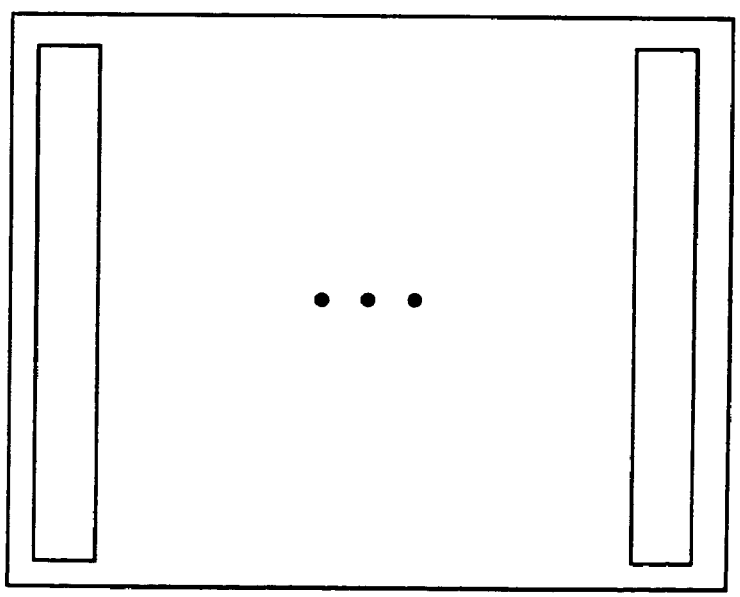
FIG. 8D illustrates a bottom layer of a passive matrix display backplane in accordance with one embodiment of the invention.

FIG. 8A illustrates an active matrix display backplane 60. The plurality of blocks in the active matrix display backplane contain the active circuit element. This display backplane is flexible. FIG. 8B illustrates a passive matrix display backplane 62. This display backplane is flexible. FIG. 8C illustrates the top layer of a passive matrix backplane. FIG. 8D illustrates the bottom layer of a passive matrix backplane.

Figure 9:
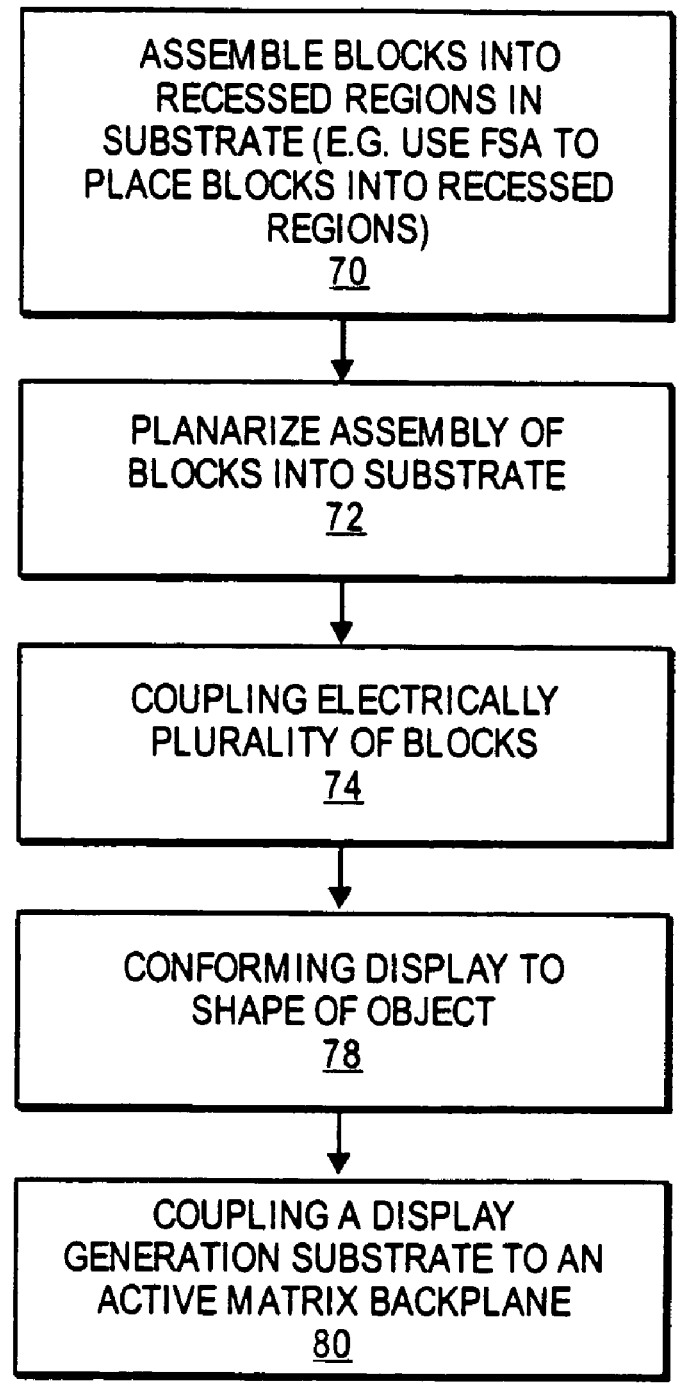
FIG. 9 illustrates a flow diagram of the method of assembling a flexible display along the length of a flexible substrate in accordance with one embodiment of the invention.

FIG. 9 illustrates one method of assembling a flexible display along the length of a flexible substrate 70 in accordance with an embodiment of the invention. First, blocks are assembled into the openings of the flexible substrate by the FSA process such that a plurality of blocks in a slurry are deposited over the recessed regions of the flexible substrate. Planarization of the assembly of blocks into substrate 72 is the next step. Planarization takes place by depositing a material that may be spun to flatten or may be subjected to conventional chemical-mechanical polishing. Then, the electrical coupling of the plurality of blocks takes place at step 74 by opening holes in the planarization layer and depositing metalization material or other conductive materials into the holes and beyond the holes to form an interconnect (e.g., a row or column interconnect). The interconnect between the rows and columns is comprised of flexible and conductive material. For example, the interconnect could be made of conductive polymers, metals (e.g., aluminum, copper, silver, gold, etc.), metal particles, conductive organic compounds, or conductive oxides. The display is made to conform the object's shape 78. It should be noted that the operations for forming the display may be done in a different order than that found in FIG. 9 and thus the operation 78 may be performed after operation 80. Preferably, a display generation substrate (e.g., a PDLC layer) is coupled to the active matrix backplane 80.

Figure 10:
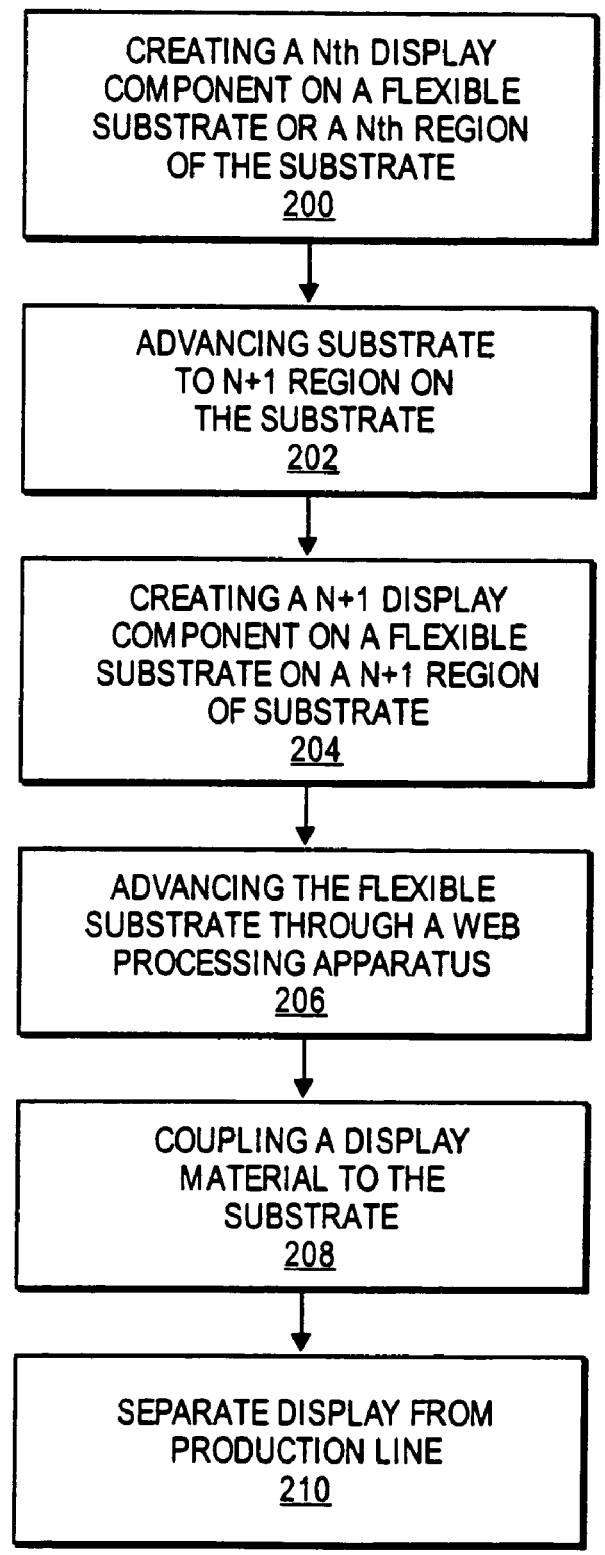
FIG. 10 illustrates a flow diagram of the method of manufacturing multiple flexible displays along a flexible substrate in accordance with one embodiment of the invention.

FIG. 10 illustrates a method of manufacturing multiple displays along a flexible substrate. Multiple display components are created on a flexible substrate 200. The flexible substrate is advanced to a second region on the substrate 202. A new display component is created on the flexible substrate in a different region of the substrate 204 by advancing the flexible substrate through a web processing of apparatus 206 and coupling a display material to the substrate 208. Separation of the display panel occurs at the end of the process 210.

Figure 11:
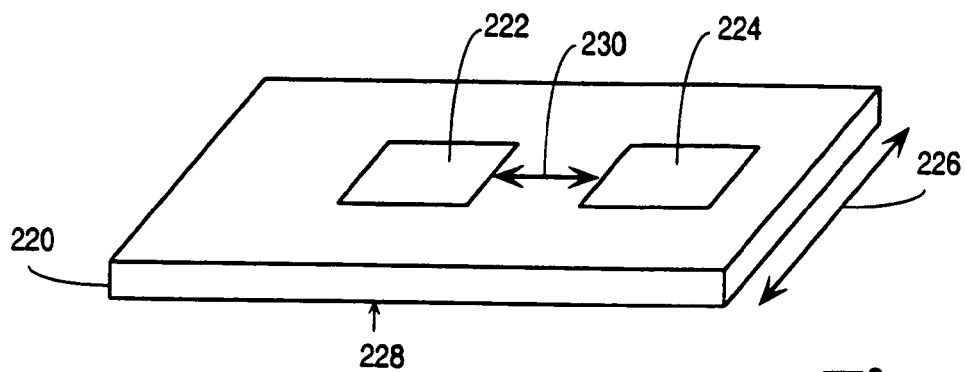
FIG. 11 illustrates a top view of a flexible substrate with multiple display components fabricated thereon in accordance with one embodiment of the invention.

FIG. 11 illustrates a flexible substrate with multiple display components. The flexible substrate 220 has display component 222 and display component 224 attached thereto. The substrate has three lengths: a first length 226, a second length 228, and a third length 230. Display components 222 and 224 are active matrix display devices.

Figure 12A:
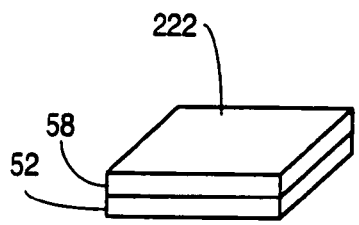
FIG. 12A illustrates a top view of a display component that has a passive matrix display backplane attached thereto in accordance with one embodiment of the invention.
Figure 12B:
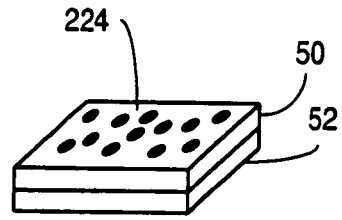
FIG. 12B illustrates a top view of a display component that has an active matrix display backplane attached thereto in accordance with one embodiment of the invention.

FIG. 12A illustrates display component 222 that has a passive matrix display backplane attached thereto. FIG. 12B illustrates a display component 224 that has an active matrix display backplane attached thereto.

Figure 13:
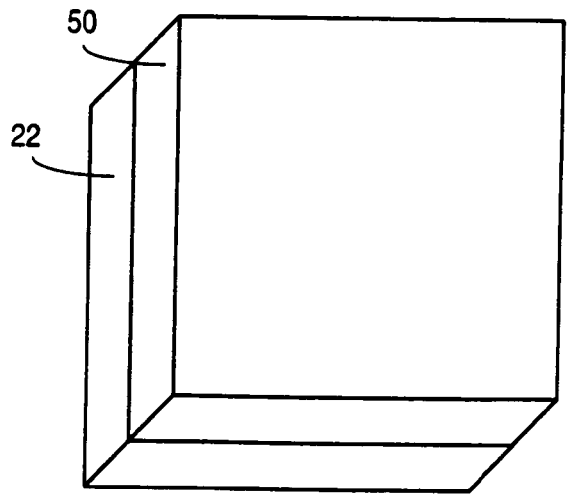
FIG. 13 illustrates a top view of flexible substrate attached to a display backplane in accordance with one embodiment of the invention.

FIG. 13 illustrates a flexible substrate 50 attached to a display backplane.

Figure 14A:
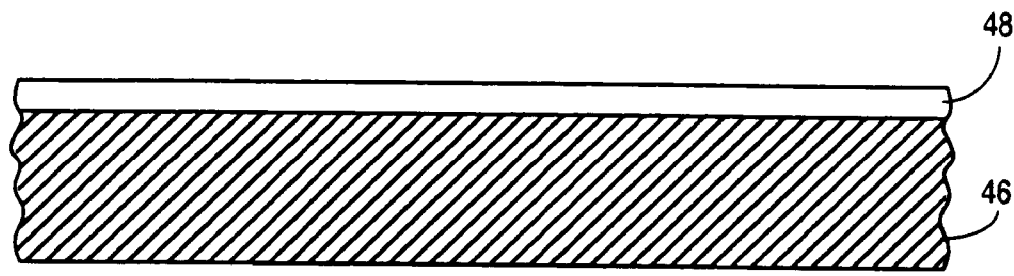
FIG. 14A illustrates a cross-sectional view of a backplane interconnect layer coupled to a flexible substrate in accordance with one embodiment of the invention.
Figure 14B:
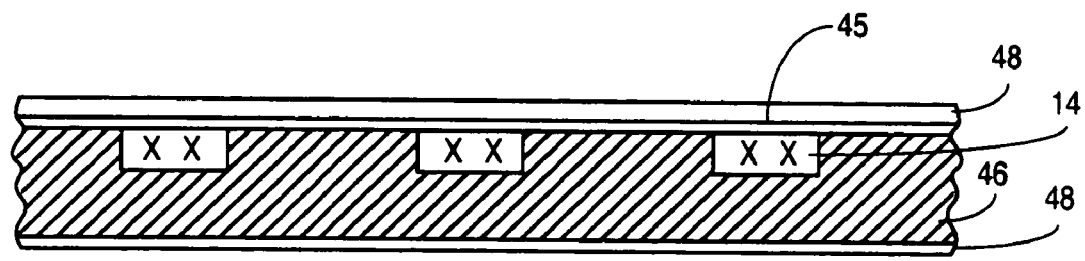
FIG. 14B illustrates a cross-sectional view of a backplane interconnect layer coupled to a flexible substrate in which blocks are coupled to the backplane interconnect layer and to the flexible substrate in accordance with one embodiment of the invention.
Figure 14C:
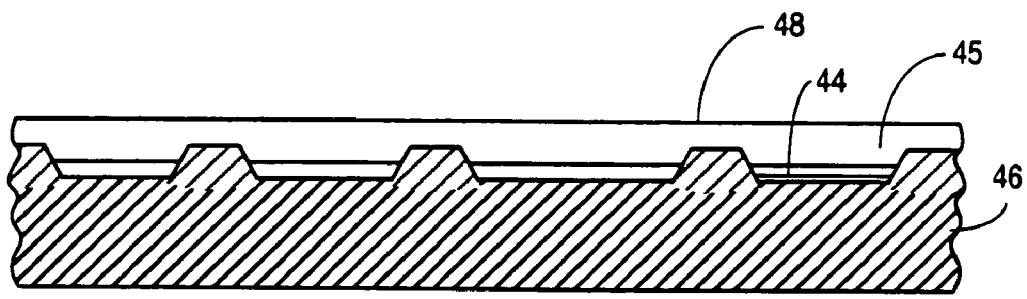
FIG. 14C illustrates a cross-sectional view of a flexible reflective display coupled to a flexible substrate that has holes or recessed regions configured to receive blocks in accordance with one embodiment of the invention.

FIG. 14A illustrates a reflective display backplane 48 coupled to a flexible substrate 46. FIG. 14B illustrates a flexible reflective display backplane 48 coupled to substrate 46. Blocks 14 are coupled to the flexible substrate 46 and to flexible reflective display backplane 48. The reflective display backplane includes interconnect layer 45. This interconnect layer 45 typically is comprised of metallic material. Coupled to the flexible substrate is flexible reflector 48. FIG. 14C illustrates a flexible reflective display in which recessed region 45 contains reflective material 44. Substrate 46 is coupled to the reflective display backplane 48.

Figure 15A:
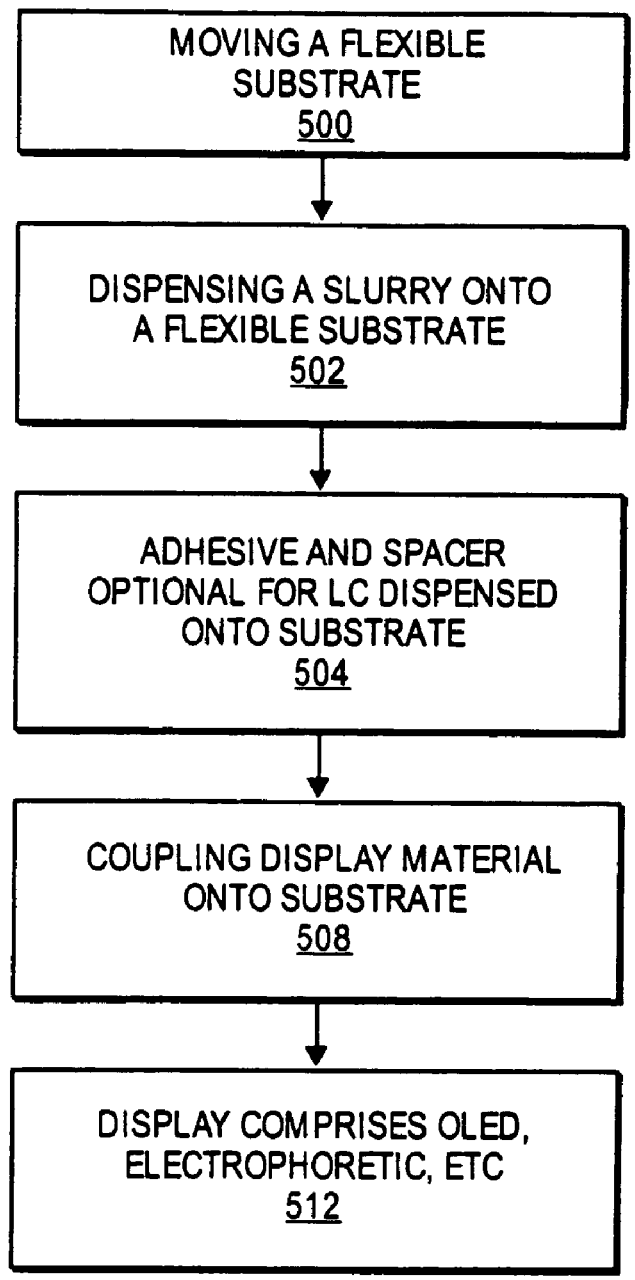
FIG. 15A illustrates a flow diagram of a method of fabricating a display device in which a flexible substrate and a display tape undergo processing and are subsequently coupled in accordance with one embodiment of the invention.

FIG. 15A illustrates a method of fabricating a display device in which a flexible substrate and a display tape undergo processing and are subsequently coupled. There, the flexible substrate is advanced along a process line 500. A slurry containing a plurality of blocks is dispensed onto the flexible substrate 502. A second slurry containing a plurality of blocks is again dispensed onto the substrate. Excess slurry is collected in a container and is recycled. The blocks fall into recessed regions in the substrate. Adhesives and spacers are deposited onto the substrate 504. Display material is placed onto the substrate 508. This material may comprise polymer-dispersed liquid crystal, cholesteric liquid crystal, electrophoretic liquid crystal, upconverting phosphor, or downconverting phosphor 512.

Figure 15B:
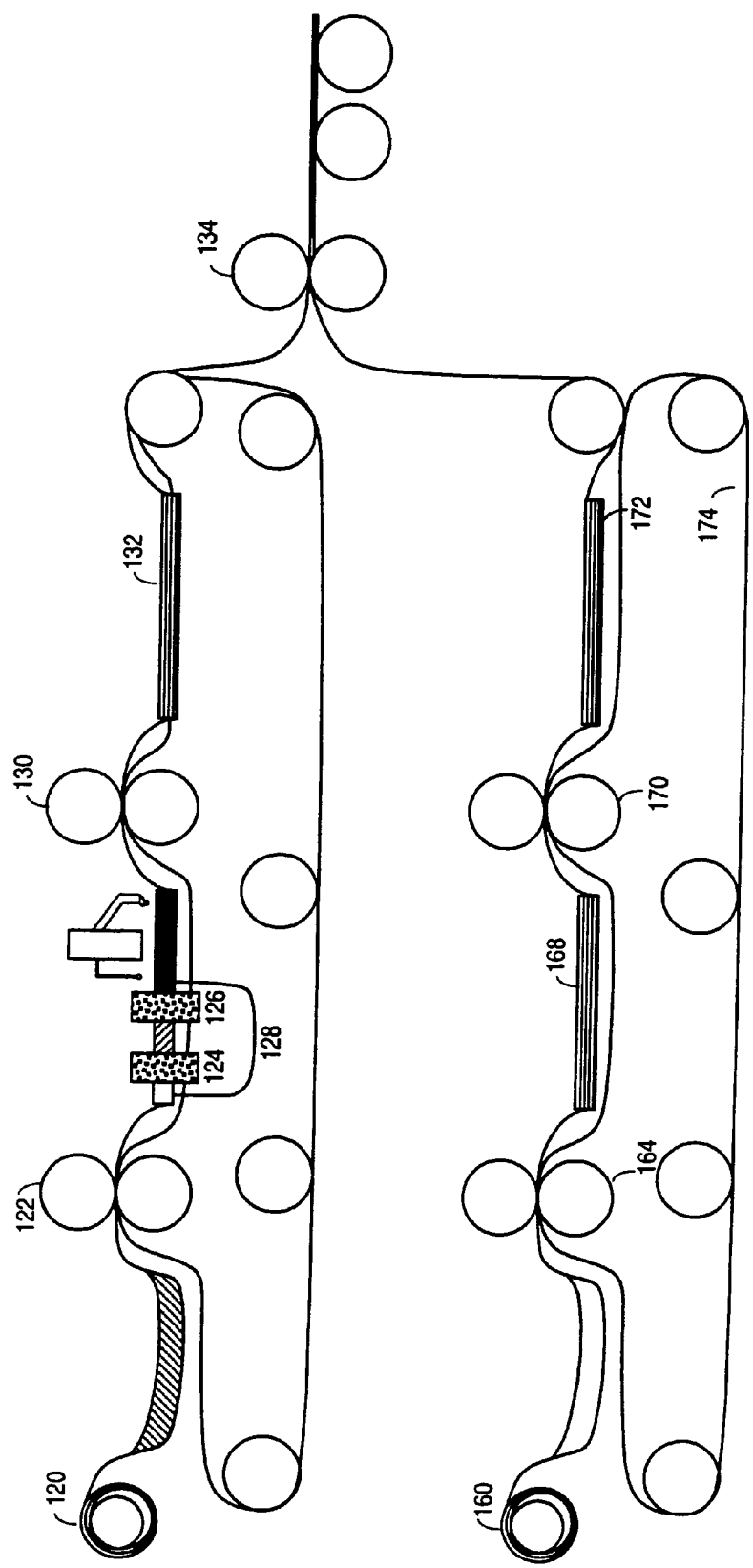
FIG. 15B illustrates schematically fabrication of a display device in which a flexible substrate and a display tape undergo processing and are subsequently coupled in accordance with one embodiment of the invention.

FIG. 15B illustrates the overall process of fabricating a display device in which a flexible substrate 120 and a display tape 160 undergo processing and are subsequently coupled. There, the flexible substrate is advanced along a first process line and advances through a first set of support members 122. The flexible substrate may be web material that has varying length to width of the web material. For example, the flexible material may have length to width ratios of 100:1, 80:1, 50:1, 25:1, 10:1, 5:1, or any other suitable ratio. A first slurry 124 containing a plurality of blocks is dispensed onto the flexible substrate. A second slurry 126 containing a plurality of blocks is again dispensed onto the substrate. Excess slurry is collected in a container 128 and is recycled. The blocks fall into recessed regions in the substrate. It should be noted that a polarizing or retarding film could be deposited onto the substrate before the FSA process is applied to the substrate. Flexible substrate 120 is advanced through a second set of support members 130. Interconnect 132 is then deposited onto flexible substrate 120. The flexible substrate is then advanced to point 134. In conjunction with this process, display tape 160 undergoes a separate process. Display material is placed onto at least one side of the display tape 160. Display tape 160 is advanced through a first set of support members 164. The display material is patterned or layered 168. This display material may comprise polymer-dispersed liquid crystal, cholesteric liquid crystal, or electrophoretic liquid crystal. Display tape 160 is advanced through a second set of support members 170. Interconnect 172 is either deposited or etched onto the display tape 160. The display tape is then advanced to point 134 where the display tape is coupled to the substrate. A conveyor belt 174 surrounds the support members. While the process may follow these steps, it should be noted that it is also possible that one portion of the display will be singulated prior to the display tape being attached to the substrate.

Figure 16:
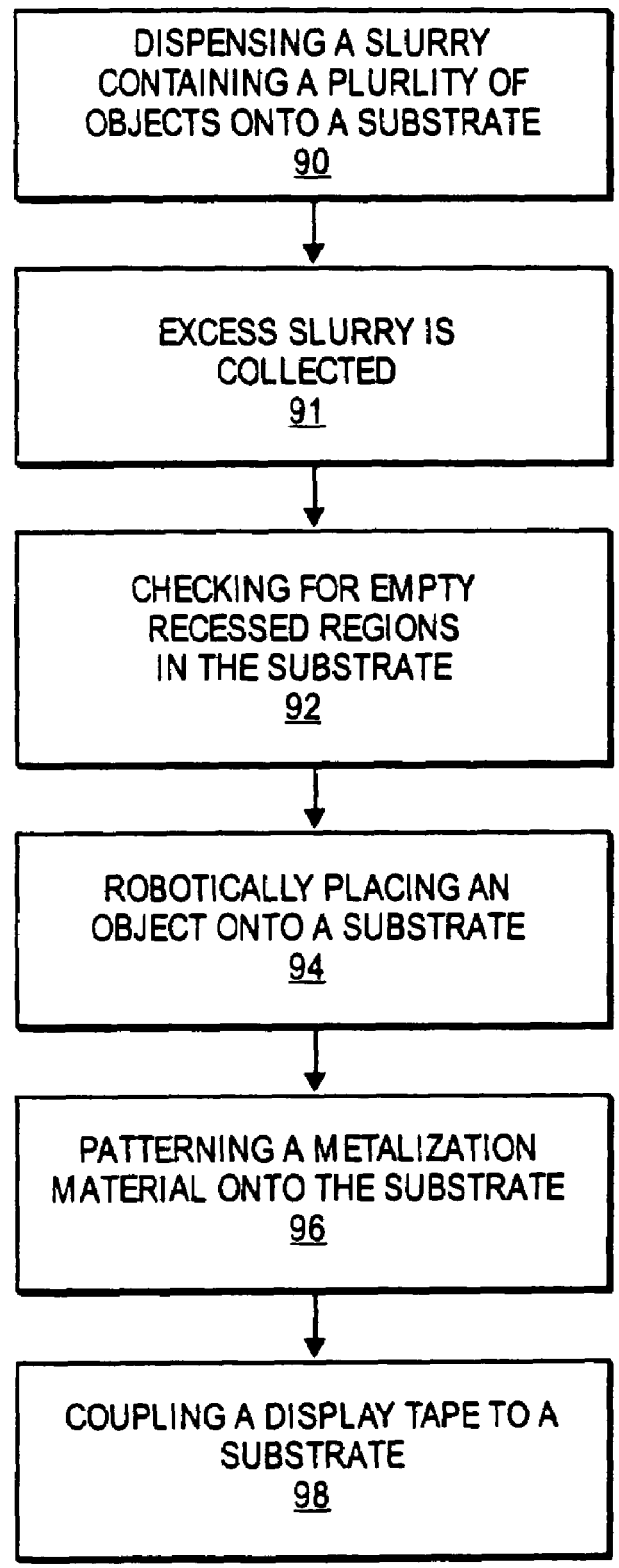
FIG. 16 illustrates a flow diagram of a method of picking and placing objects onto a flexible substrate after the FSA process has been applied to the substrate in accordance with one embodiment of the invention.

FIG. 16 relates to a method of picking and placing of objects onto a flexible substrate after the FSA process has been applied to the substrate. A slurry containing a plurality of objects is dispensed onto the substrate 90. The objects fall into recessed regions in the substrate. The excess slurry is collected and recycled 91. The substrate is checked for empty recessed regions 92. This checking is performed by an electronic eye that views the substrate. Objects are robotically placed into empty regions found in substrate 94. A metalization material is placed onto at least one of the substrate's surfaces and is patterned or etched 96. The display tape is coupled to the substrate 98. Objects may also be robotically placed in open holes or recessed regions that may be deliberately not filled by the FSA process. This may be done either before or after the FSA process.

Figure 17:
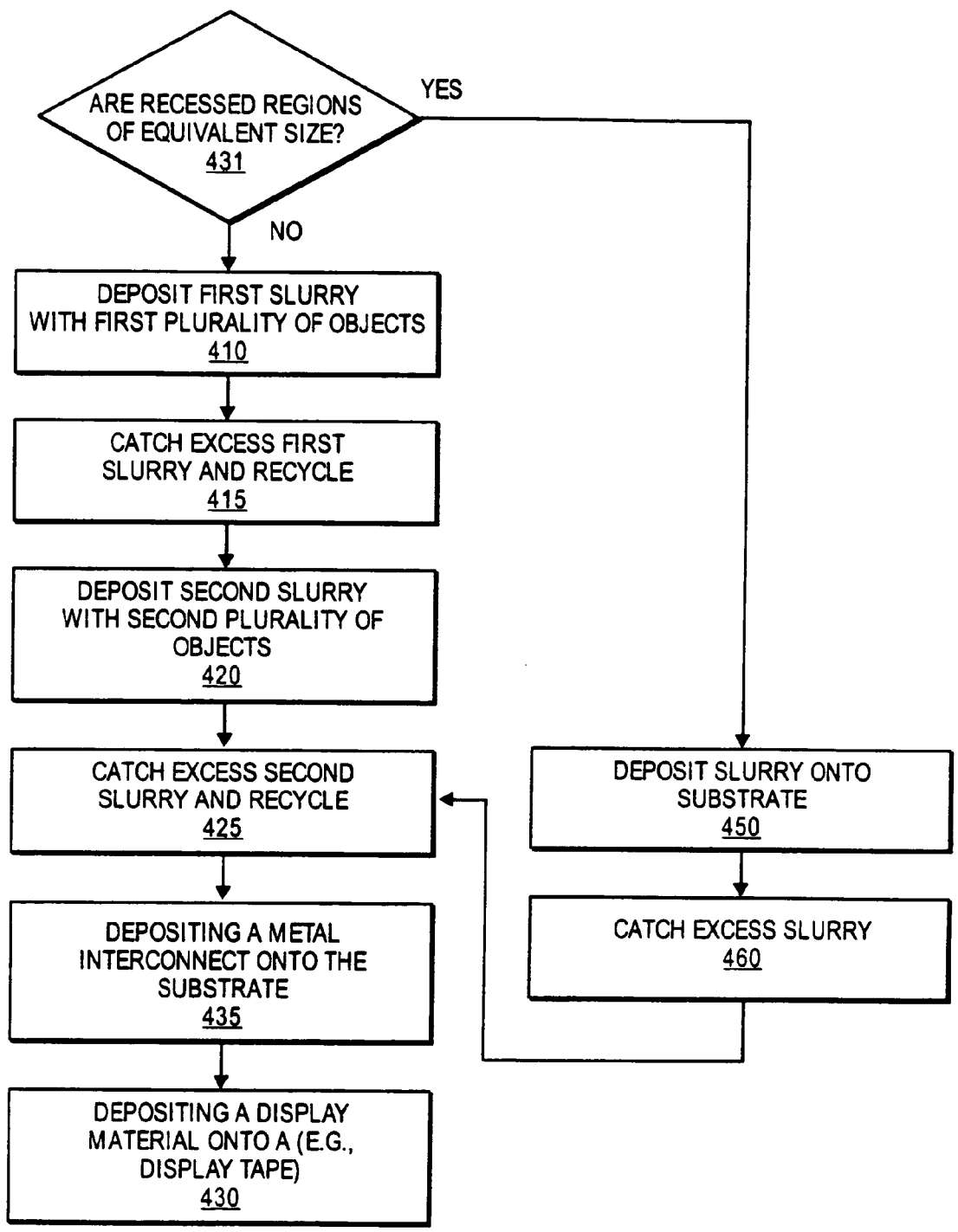
FIG. 17 illustrates a flow diagram that relates to the FSA process and the coupling of the display material to the substrate in accordance with one embodiment of the invention.

FIG. 17 relates to the FSA process and the coupling of the display material with the substrate. At step 431, a determination may be made as to whether the recessed regions are of equivalent size. If the recessed regions are of equivalent size, step 450 is then followed. If not, a first slurry with a first plurality of objects is deposited onto the substrate 410. Excess slurry is caught and recycled 415. Once this step is performed, a second slurry with a second plurality of objects is placed onto the substrate 420. Excess second slurry is recycled into a second container 425. Alternatively, a plurality of blocks with a variety of shapes are dispensed at about the same time over the substrate. A metal interconnect is then deposited onto the substrate 435. After these steps, a display material is deposited onto the substrate 430.

Figure 18:
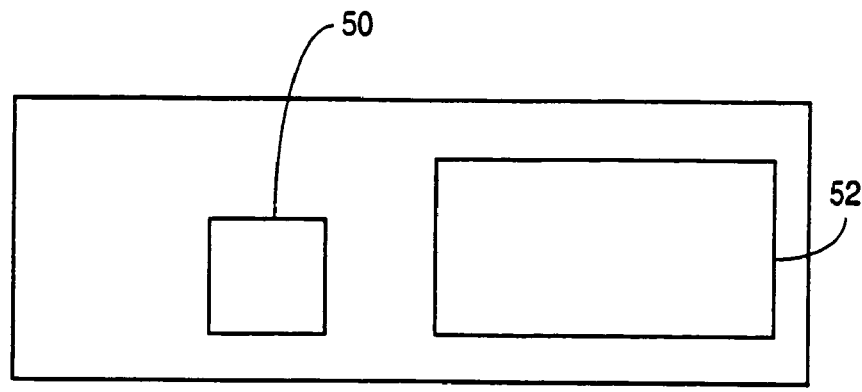
FIG. 18 illustrates a top view of a flexible continuous substrate in which displays of different sizes are created in accordance with one embodiment of the invention.
Figure 19:
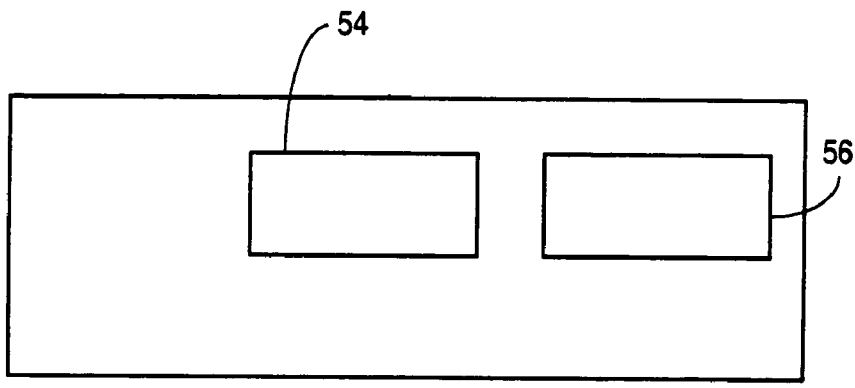
FIG. 19 illustrates a top view of a flexible continuous substrate in which displays of similar size are created in accordance with one embodiment of the invention.

FIG. 18 illustrates a flexible continuous substrate in which two displays are fabricated. Display device 52 is larger than display device 50. This shows that multiple displays of different sizes can be created on the substrate through an in-line web process. Alternatively, FIG. 19 illustrates displays 54 and 56 of similar size.

Figure 20:
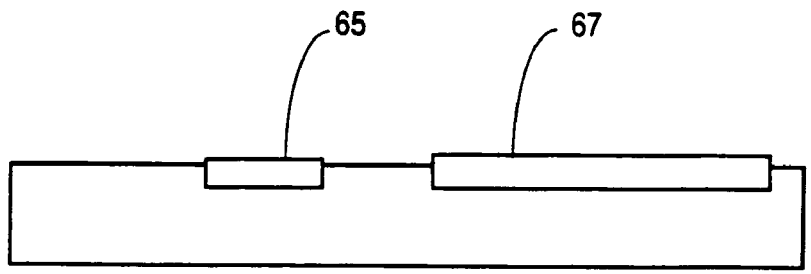
FIG. 20 illustrates a cross-sectional view of the recessed regions in the substrate in accordance with one embodiment of the invention.

In addition to multiple displays being able to be made different sizes, the substrate itself may have different sized recessed regions. This allows the substrate to receive various sized blocks or devices. FIG. 20 illustrates a cross-sectional view of the recessed regions in the substrate. Recessed region 65 is smaller than recessed region 67.

Figure 21:
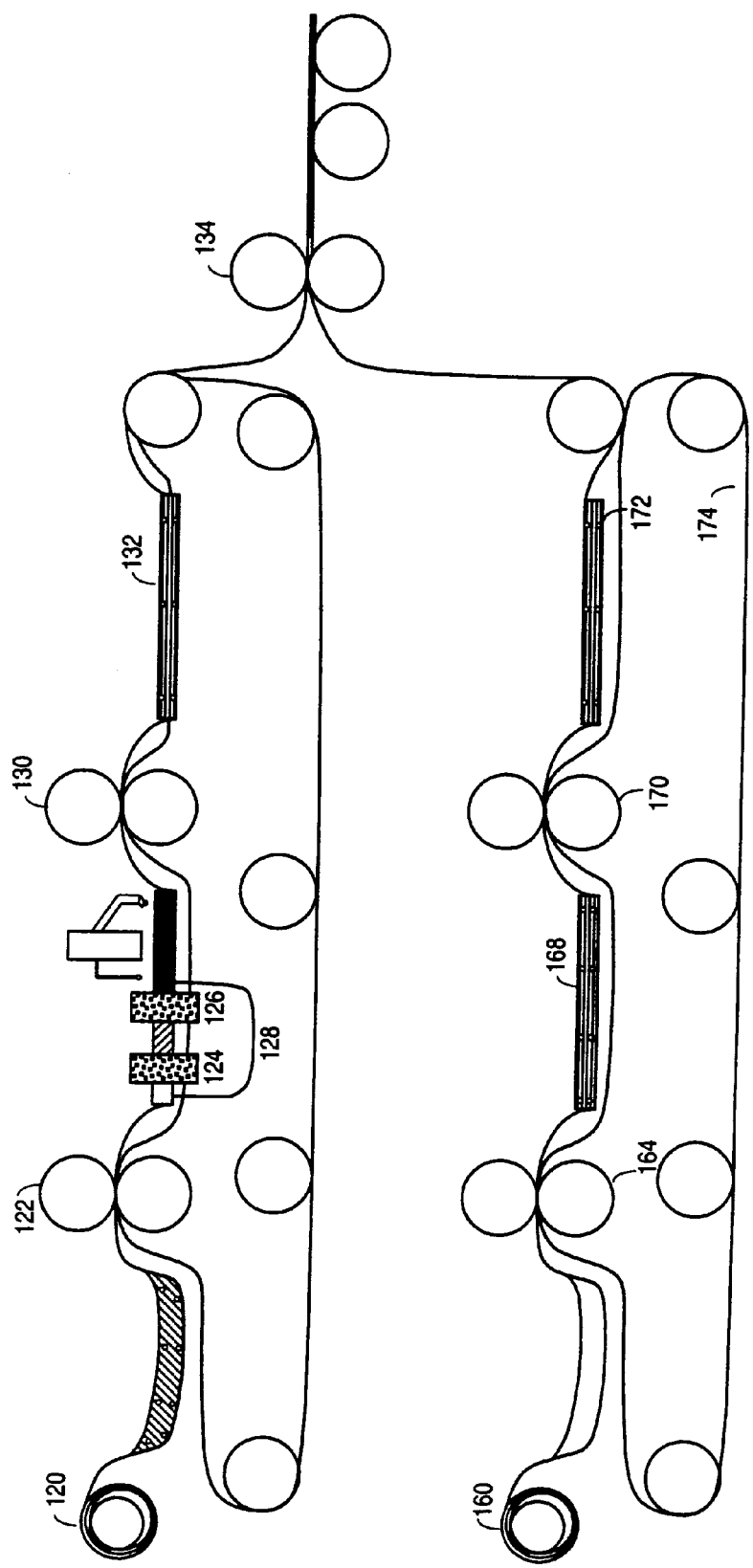
FIG. 21 illustrates an embodiment of the overall in-line process of the invention in accordance with one embodiment of the invention.

FIG. 21 illustrates an embodiment of the overall in-line process of the invention. A web apparatus machine 119 is used to process the substrate. At step 120, apertures are created in the flexible substrate. These apertures can be created by a number of methods. For example, the apertures can be punched into the substrate. Another method involves using a template to emboss the apertures into the substrate. A laser, chemical or plasma etching could also be used to create the apertures. After creating the apertures or recessed regions, the substrate advances over a plurality of support members 122. The substrate goes in between support members 123A and 123B. The FSA process is applied to the substrate. FSA comprises a slurry that contains a plurality of functional blocks. These blocks have, in one embodiment, a circuit element (not shown) that drives the picture element (not shown). The FSA process occurs at block 124. It is then applied again at 126. The excess slurry is collected in container 128. Then, the flexible substrate advances through support members 130. The flexible substrate then has an interconnect 131 deposited on the top of the flexible substrate 132. The resulting flexible substrate advances over a guide member and meets at a point 134 in which it is coupled to a display tape that in one embodiment is a flexible substrate that includes separate regions each having a display material on this flexible substrate. A different portion of the process involves the display tape 160. Before the display tape is coupled with the substrate, the display tape goes through its own separate process that is described below.

The display tape has display material 162 deposited on at least one side of the display tape. There are a variety of ways that display material may be deposited onto the display tape. For example, display material may be sprayed onto the display tape. The display material also may be placed on a screen over the display tape. Another method is to place the display tape into a container that holds the display material. The display tape advances through support members 164.

The display tape then has display material layered or patterned on the display tape at 168. This display tape then advances through another plurality of support members 170. A large area metal interconnect is then deposited or etched onto the display tape 172. This may be performed by inkjet, lithography and etch, screen print, laser etch, or deposit 174. In one embodiment of the invention, this large interconnect is a cover glass electrode. At point 134, the display tape is coupled with a substrate.

Figure 22:
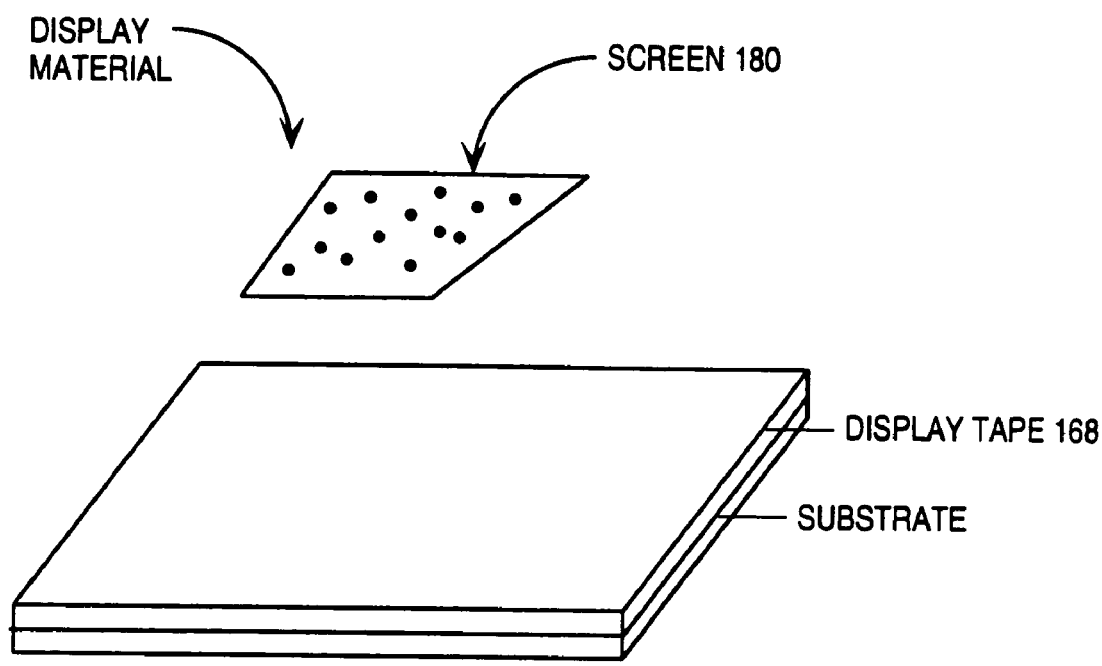
FIG. 22 illustrates a top view of display material being placed through a screen onto display tape in accordance with one embodiment of the invention.

FIG. 22 illustrates a display material being placed through a screen 180 onto display tape 168. The screen 180 has a desired pattern created by holes that go through the screen 180. This desired pattern may be dictated by a customer or by the manufacturer.

Figure 23:
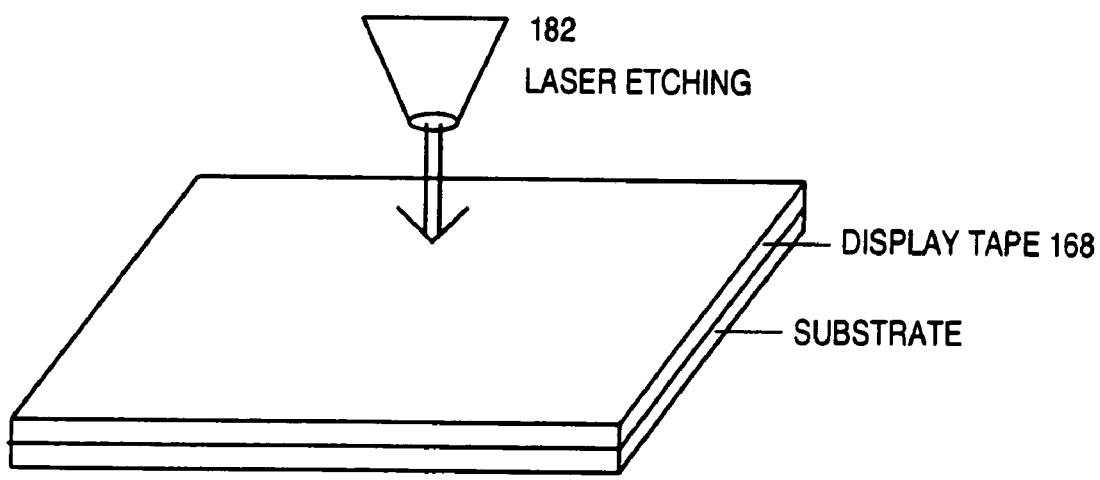
FIG. 23 illustrates a top view of display material being laser etched onto display tape in accordance with one embodiment of the invention.

Another method of placing display material onto the display tape is shown in FIG. 23. FIG. 23 illustrates a top view of display material being laser etched onto display tape 168. The etching occurs when the high intensity light from the laser 182 strikes the display material on top of the display tape 168. A pattern is created in the display material by the laser 182.

Figure 24:
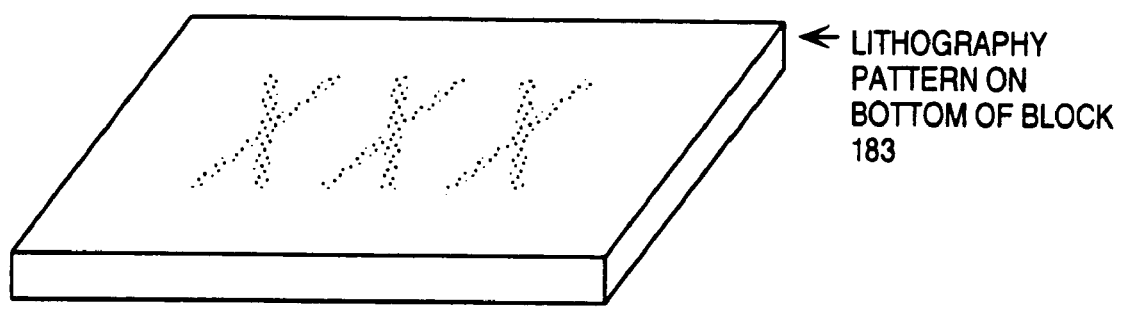
FIG. 24 illustrates a top view of display material in which lithography is used to pattern the display material in accordance with one embodiment of the invention.

Another method of depositing display material is shown in FIG. 24. FIG. 24 illustrates lithography being used to pattern the display material. Lithography involves using a block 183 with a pattern engraved in the bottom surface of the block 183. The bottom surface of the block 183 contacts the display material.

Figure 25:
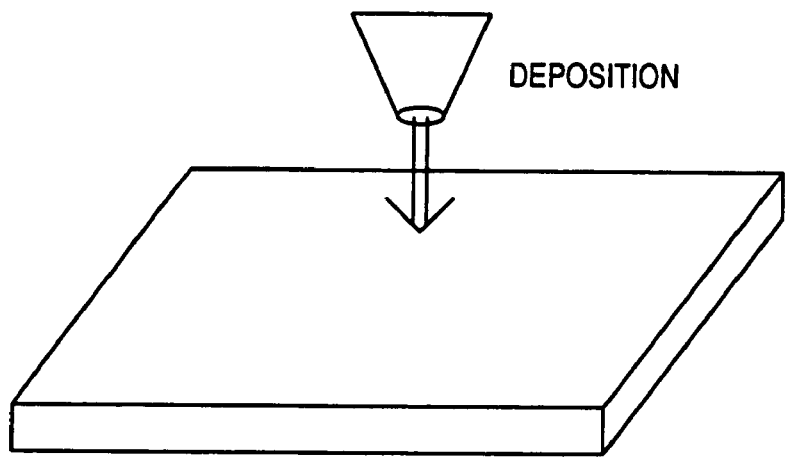
FIG. 25 illustrates a top view of display material that is deposited in a pattern onto display tape in accordance with one embodiment of the invention.

FIG. 25 illustrates yet another method of depositing display material onto the display tape. There display material is deposited in a pattern onto the display tape 168. The display material is deposited by container 183 that contains the display material. Container 183 is placed over display tape 168. The display material drops onto display tape 168 in a pattern.

Figure 26A:
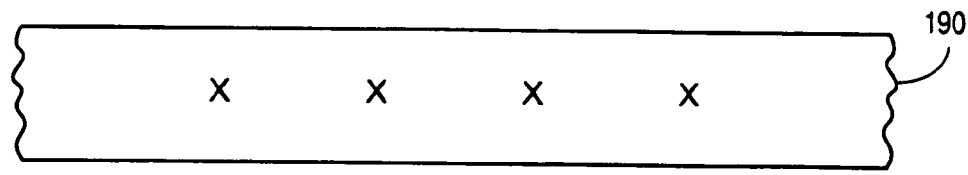
FIG. 26A illustrates a cross-sectional view of a substrate in accordance with one embodiment of the invention.
Figure 26B:
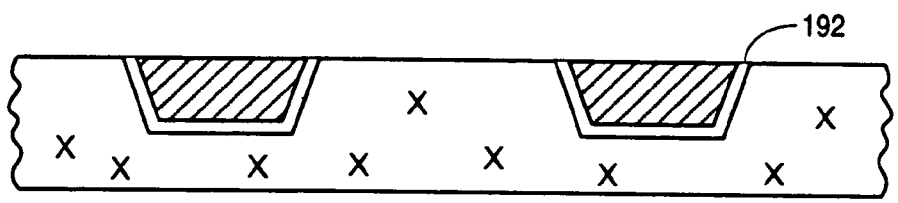
FIG. 26B illustrates cross-sectional view of the substrate of FIG. 26A in which openings or receptor regions are created and blocks are deposited therein in accordance with one embodiment of the invention.
Figure 26C:
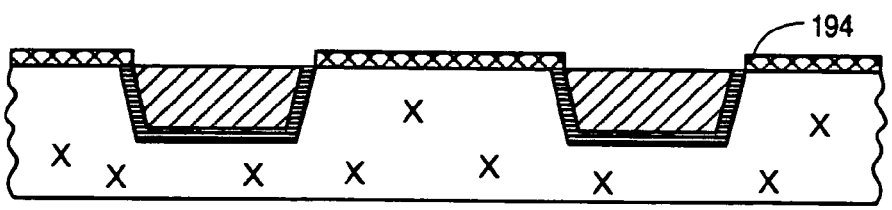
FIG. 26C illustrates deposition of planarization material and openings being created into the substrate in accordance with one embodiment of the invention.
Figure 26D:
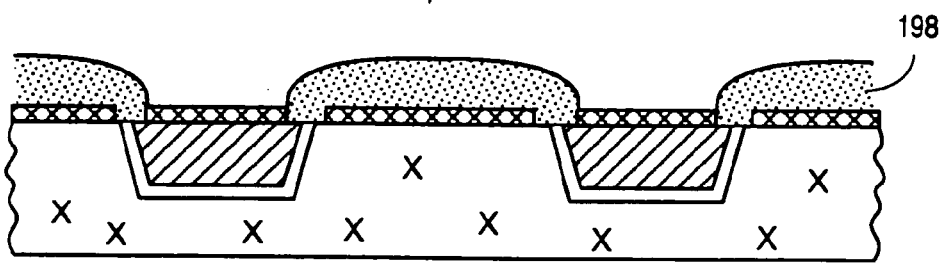
FIG. 26D illustrates interconnect that has been deposited and patterning that interconnect in accordance with one embodiment of the invention.

FIGS. 26A–26D illustrate generally the process of planarization material being added onto the substrate. FIG. 26A shows a planar side view of a substrate 190. FIG. 26B shows openings or receptor regions 192 created and blocks deposited into the substrate. FIG. 26C shows deposition of planarization material 194 and openings being created into the substrate. FIG. 26D shows deposition of interconnect 198 and pattern interconnect.

Figure 27A:
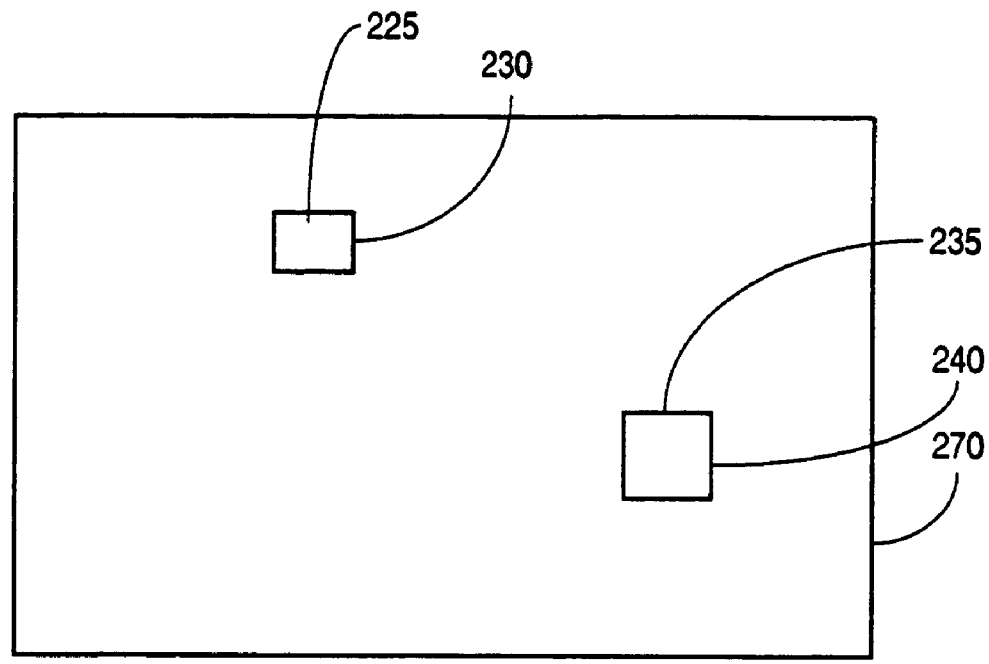
FIG. 27A illustrates a top view of a substrate in which two different sized blocks are located in the different sized recessed regions in accordance with one embodiment of the invention.
Figure 27B:
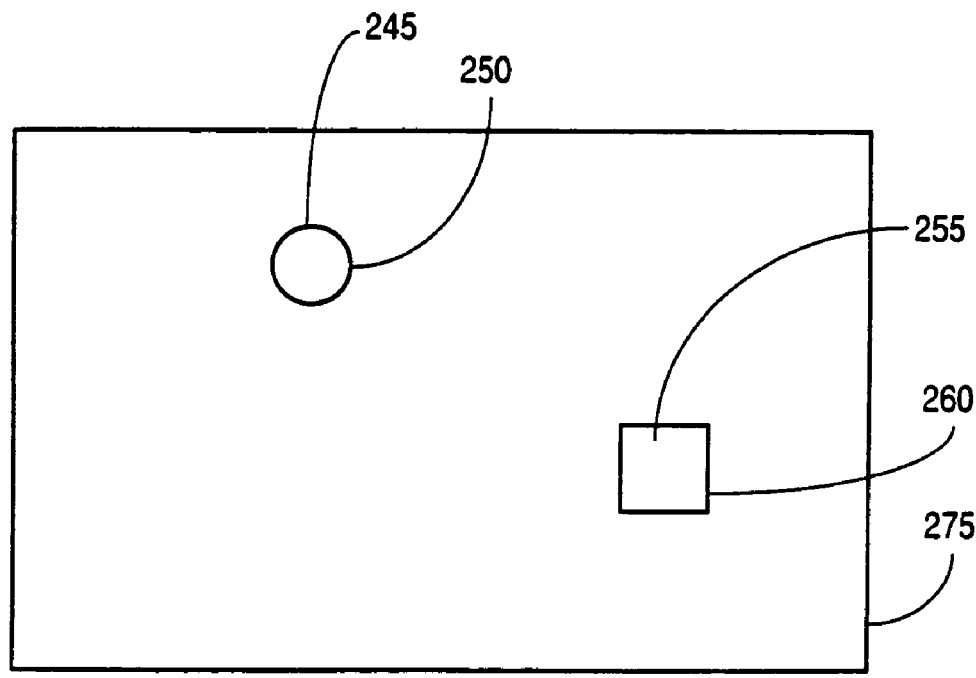
FIG. 27B illustrates a top view of a substrate in which two different sized blocks are located in the different sized recessed regions in accordance with one embodiment of the invention.

FIGS. 27A and 27B illustrate a top view of a substrate in which two different sized blocks are located in the different sized recessed regions. The substrate may be flexible or rigid. A slurry containing a plurality of different sized blocks may be dispensed over a substrate. Individual blocks may mate with corresponding recessed regions based of compatible shapes, i.e., compatible mating. Alternatively, slurries containing blocks of only one configuration may be dispensed separately over the same substrate to mate with corresponding recessed regions in the substrate. In FIG. 27A, rectangular blocks 225 have a shape compatible with recessed region 230 in substrate 270. Similarly, rectangular block 235, which, in this instance, has a larger surface area than rectangular block 225, has a shape compatible with recessed region 240 in substrate 270. FIG. 27B shows a second configuration of blocks in a substrate, in which circular block 245 has a shape compatible with circular opening 250 while rectangular block 255 has a shape compatible with rectangular opening 260 in substrate 275.

Figure 27C:
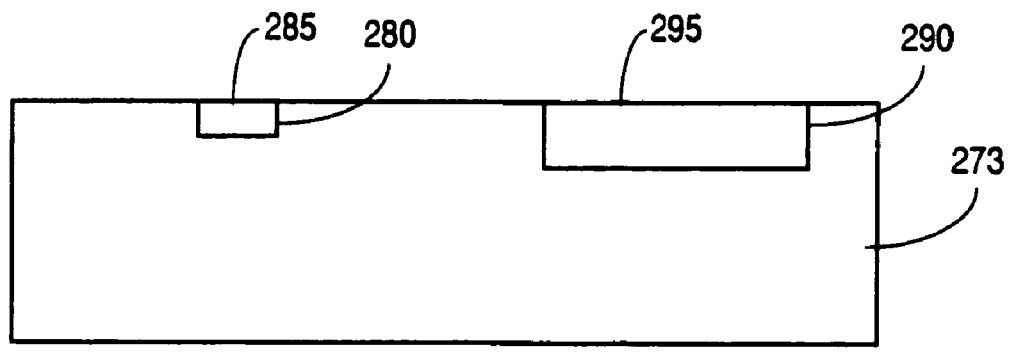
FIG. 27C illustrates cross-sectional view of a substrate in which two different sized blocks are located in a substrate in accordance with one embodiment of the invention.
Figure 27D:
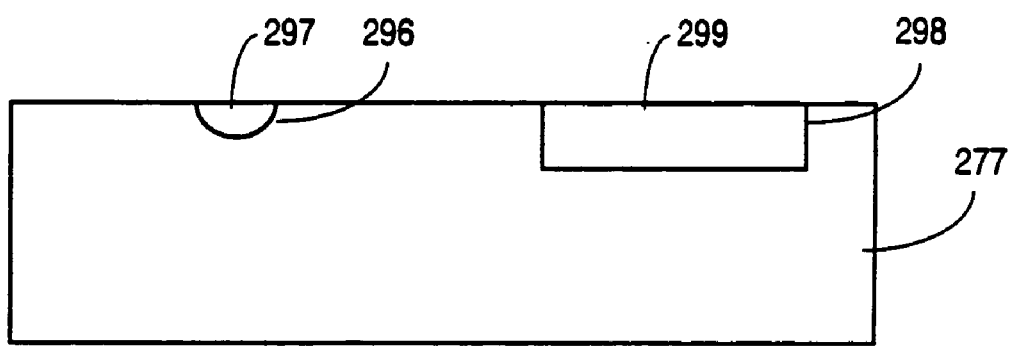
FIG. 27D illustrates a cross-sectional view of a substrate in which two different sized blocks are located in the substrate in accordance with one embodiment of the invention.

FIGS. 27C and 27D illustrate alternative configurations utilizing differently-sized blocks mated with correspondingly-sized recessed regions in a substrate. The substrate may be flexible or rigid. In FIG. 27C, rectangular block 285 has a shape compatible with recessed region 280 in substrate 273. In this example, rectangular block 285 has both an area and a volume corresponding to a similar area and volume of recessed region 280. Similarly, rectangular block 295 has a shape (area and volume) compatible with recessed region 280. FIG. 27D illustrates a configuration where block 297 has a semi-circular or semi-cylindrical volume corresponding to similarly-shaped recessed region 296 in substrate 277. Rectangular block 299 has a shape (area and volume) similar to recessed region 298 in substrate 277.

Figure 28:
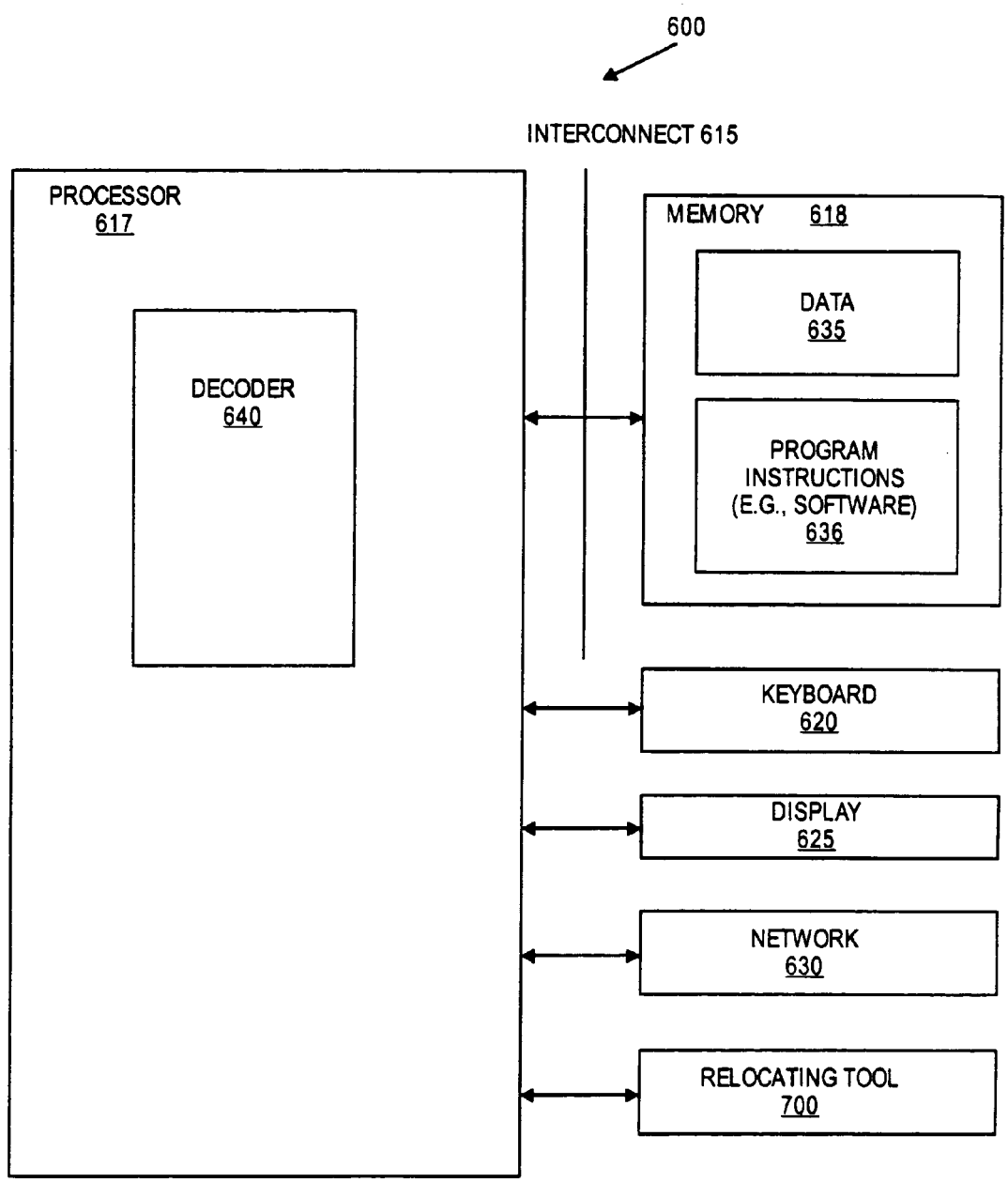
FIG. 28 illustrates a computer system in accordance with one embodiment of the invention.

FIGS. 28 through 33 illustrate one embodiment of a computer system 600 that implements some of the principles of the present invention related to a relocating tool. Referring to FIG. 28, computer system 600 is used to locate precise locations on a substrate that require the placement of objects such as blocks. Computer system 600 then causes a relocating tool to pick up blocks from a first substrate and place those blocks into precise locations onto a second substrate.

Computer system 600 comprises a processor 617, a storage device 618, and interconnect 615 such as bus or a point-to-point link. Processor 617 is coupled to the storage device 618 by interconnect 615. In addition, a number of user input/output devices, such as a keyboard 620, a display 625, and relocating tool 700 are coupled to chip set (not shown) which is then connected to processor 617. The chipset (not shown) is typically connected to processor 617 using an interconnect that is different from interconnect 615.

Processor 617 represents a central processing unit of any type of architecture (e.g., the Intel architecture, Hewlett Packard architecture, Sun Microsystems architecture, IBM architecture, etc.), or hybrid architecture. In addition, processor 617 could be implemented on one or more chips. Storage device 618 represents one or more mechanisms for storing data such as the number of times the second code is checked and the results of checking the second code. Storage device 618 may include read only memory (ROM), random access memory (RAM), magnetic disk storage mediums, optical storage mediums, flash memory devices, and/or other machine-readable mediums. Interconnect 615 represents one or more buses (e.g., accelerated graphics port bus, peripheral component interconnect bus, industry standard architecture bus, X-Bus, video electronics standards association related to buses, etc.) and bridges (also termed as bus controllers).

While this embodiment is described in relation to a single processor computer system, the invention could be implemented in a multi-processor computer system. In addition to other devices, one or more of a network 630 may be present. Network 630 represents one or more network connections for transmitting data over a machine readable media. The invention could also be implemented on multiple computers connected via such a network.

FIG. 28 also illustrates that the storage device 618 has stored therein data 635 and program instructions (e.g. software, computer program, etc.) 636. Data 635 represents data stored in one or more formats. Program instructions 636 represents the necessary code for performing any and/or all of the techniques described with reference to FIGS. 29 through 32 such as determining the precise location on a substrate to place at least one block. It will be recognized by one of ordinary skill in the art that the storage device 618 preferably contains additional software (not shown), which is not necessary to understanding the invention.

FIG. 28 additionally illustrates that the processor 617 includes decoder 640. Decoder 640 is used for decoding instructions received by processor 617 into control signals and/or microcode entry points. In response to these control signals and/or microcode entry points, decoder 640 performs the appropriate operations.

Described below are various techniques that are implemented to achieve the various features of the embodiments of the invention.

Figure 29:
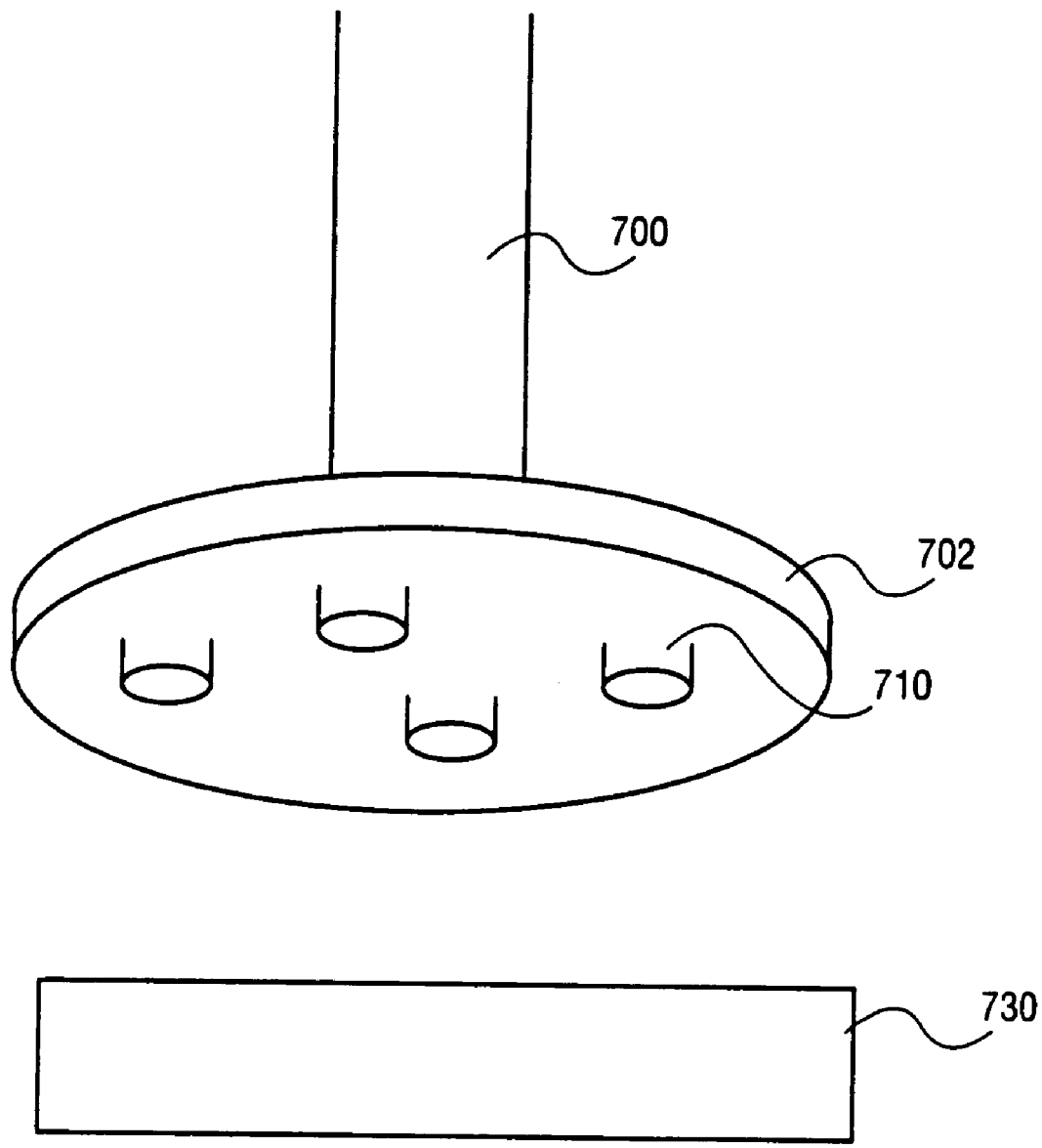
FIG. 29 illustrates a relocating tool in accordance with one embodiment of the invention.

FIGS. 29–34 illustrate a plurality of blocks picked up from first substrate 730 using relocating tool 700 and then placing the plurality of blocks onto second substrate 740. FIG. 29 illustrates one embodiment of relocating tool 700. In one embodiment, relocating tool 700 has disk-shaped head 702 that has a plurality of relocating members 710. Disk-shaped head 702 may have a diameter approximately in the range of 5 millimeters (mm) to 100 mm and may have a thickness in the range of 0.5 mm to 10 mm. In one embodiment, relocating members 710 are shown to be generally cylindrical in shape. The proximal end of relocating members 710 are secured or integrally formed into disk-shaped head 702 using conventional methods. Relocating members 710 have a length that ranges from approximately 5 mm to 100 mm and a diameter that ranges from 5 mm to 100 mm. It will be appreciated that although relocating tool 700 is described in relation to a disk and relocating members as substantially cylindrical, other shapes may also be used to form various shaped relocation tools. For example, relocating tool 700 may have a shape of a head that is substantially square, rectangular, triangular, a pentagon, a hexagon or any other suitable shape. Similarly, relocating members 710 may have a distal tip that is substantially square, rectangular, triangular, circular, a pentagon, a hexagon or any other suitable shape that is capable of picking up objects such as blocks from a first substrate and transferring the blocks to a second substrate.

Figure 30:
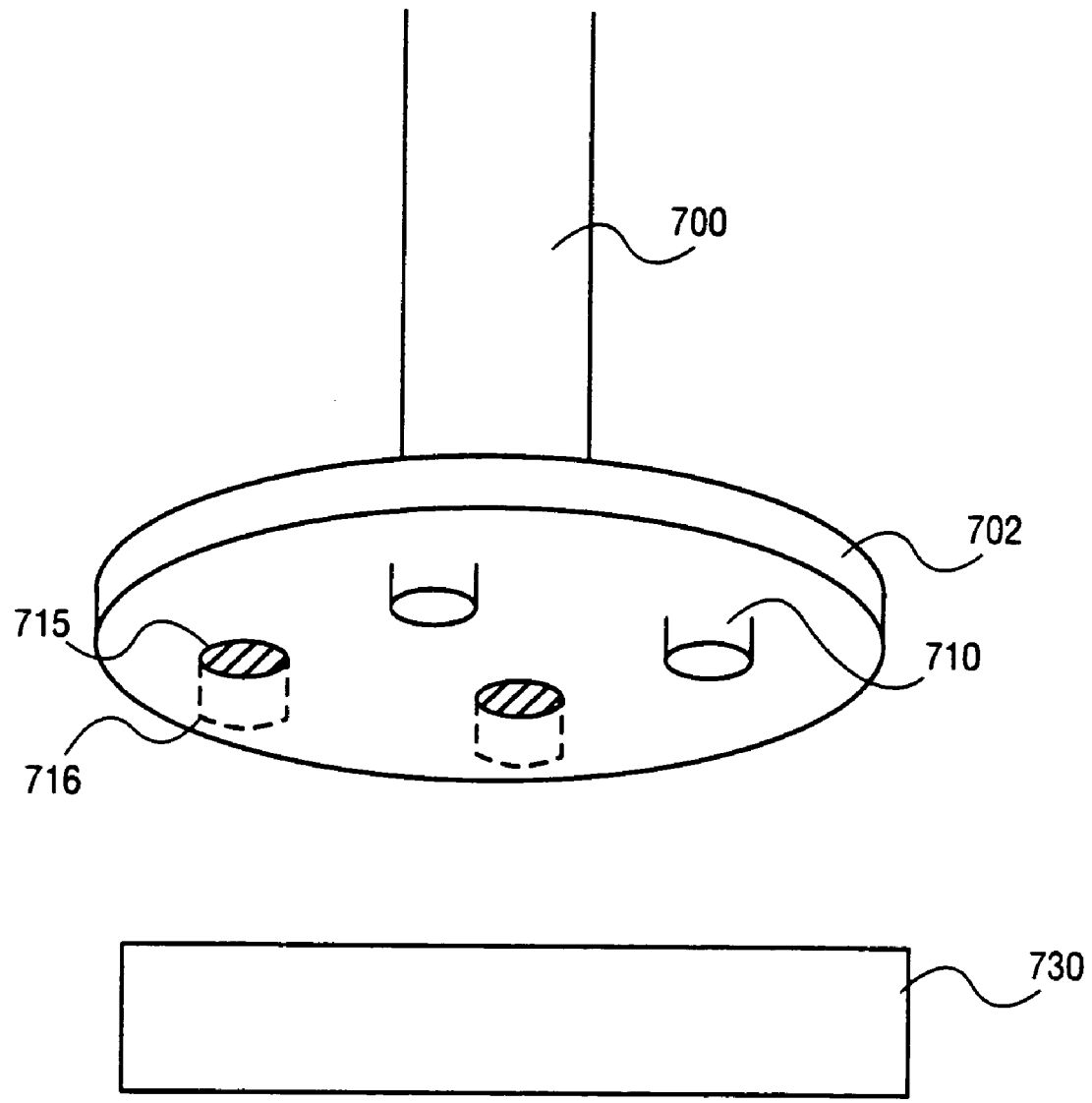
FIG. 30 illustrates relocating members configured to move in a vertical direction in accordance with one embodiment of the invention.

In one embodiment, relocating members 710 may be selectively moved in a vertical direction from a position flush with the surface to its fully extended position 716 as illustrated in FIG. 30. This allows some relocating members 715 to be flush with the distal surface of the disk while other relocating members 710 protrude from the distal surface of the disk. Additionally, relocating members 710 may extend the same length or to different lengths from disk 702. In one embodiment, relocating members 710 are selectively extended by executing the program instructions on computer system 600. In another embodiment, relocating members 710 may be manually moved.

Figure 31:
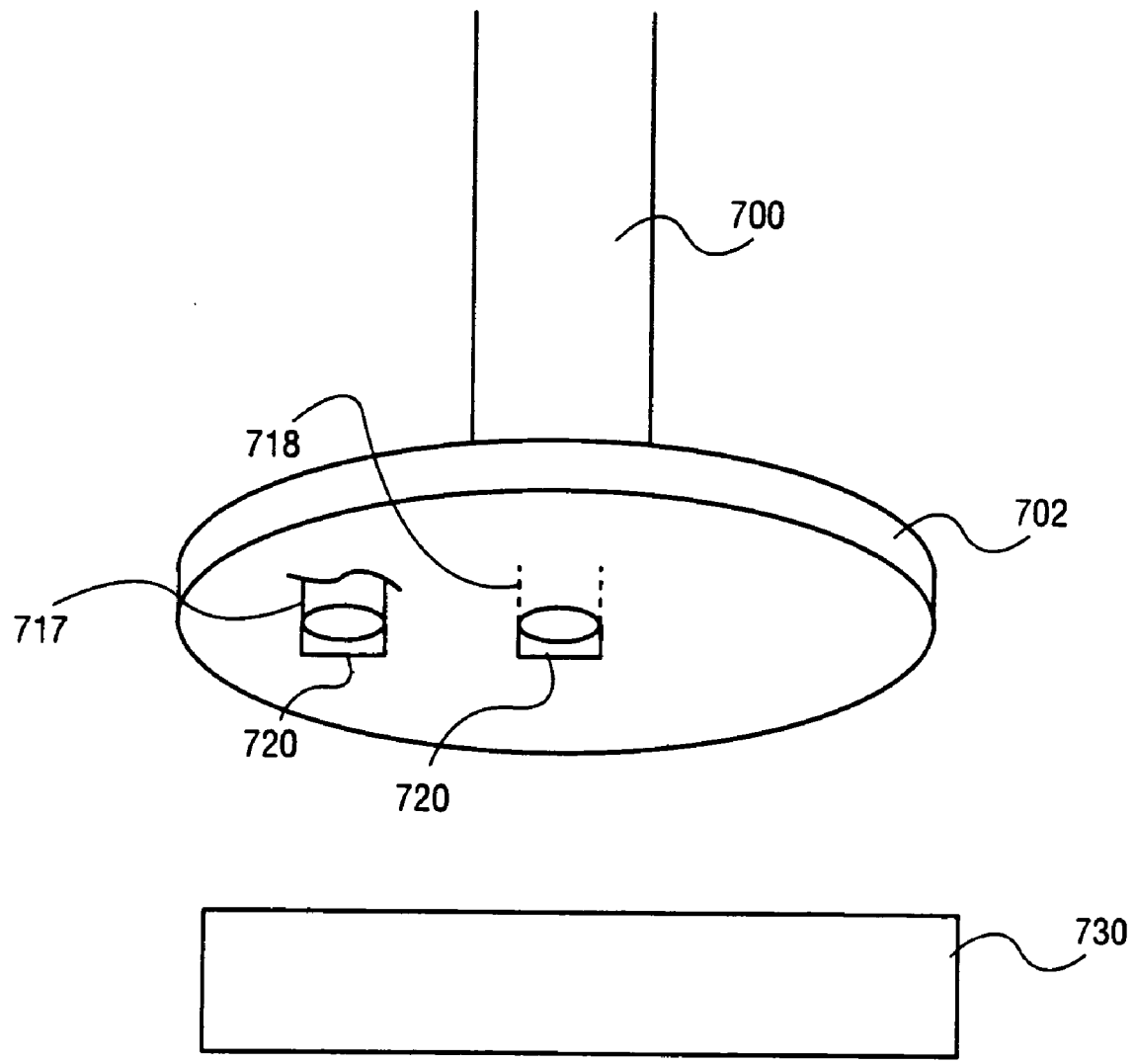
FIG. 31 illustrates relocating members configured to move in a horizontal direction in accordance with one embodiment of the invention.

Computer system 600 causes relocating member 700 to move in a horizontal direction from position 717 to position 718 relative to first substrate 730 corresponding to the recessed regions adapted to receive blocks as illustrated in FIG. 31. Computer system 600 properly locates each relocating member 710 by using, for example, an electronic eye that scans the surface of the substrate. This information is transmitted to computer system 600 that may display the image to a user on a graphic user interface. The user may then designate the location of each recessed region to receive the block. Alternatively, computer system 600 may automatically designate each recessed region to receive a block based upon program instructions that incorporate principles designated by a user or a system designer. Such principles may include the distance between at least two blocks, the number of blocks located on a substrate, the location of empty recessed regions, or any other suitable principle.

Protruding relocating members 710 may then place the objects such as blocks onto a second substrate without interference from other unnecessary relocating members preventing or affecting the placement of some of the blocks. For example, a substrate generally is not perfectly flat. There may be some areas on the substrate that are higher or lower than other areas of the substrate. A relocating member that is unnecessarily extended may contact the surface of the substrate before another relocating member can place a block into a recessed region. Accordingly, unnecessary relocating members are retracted to ease placement of blocks onto a substrate.

Figure 32:
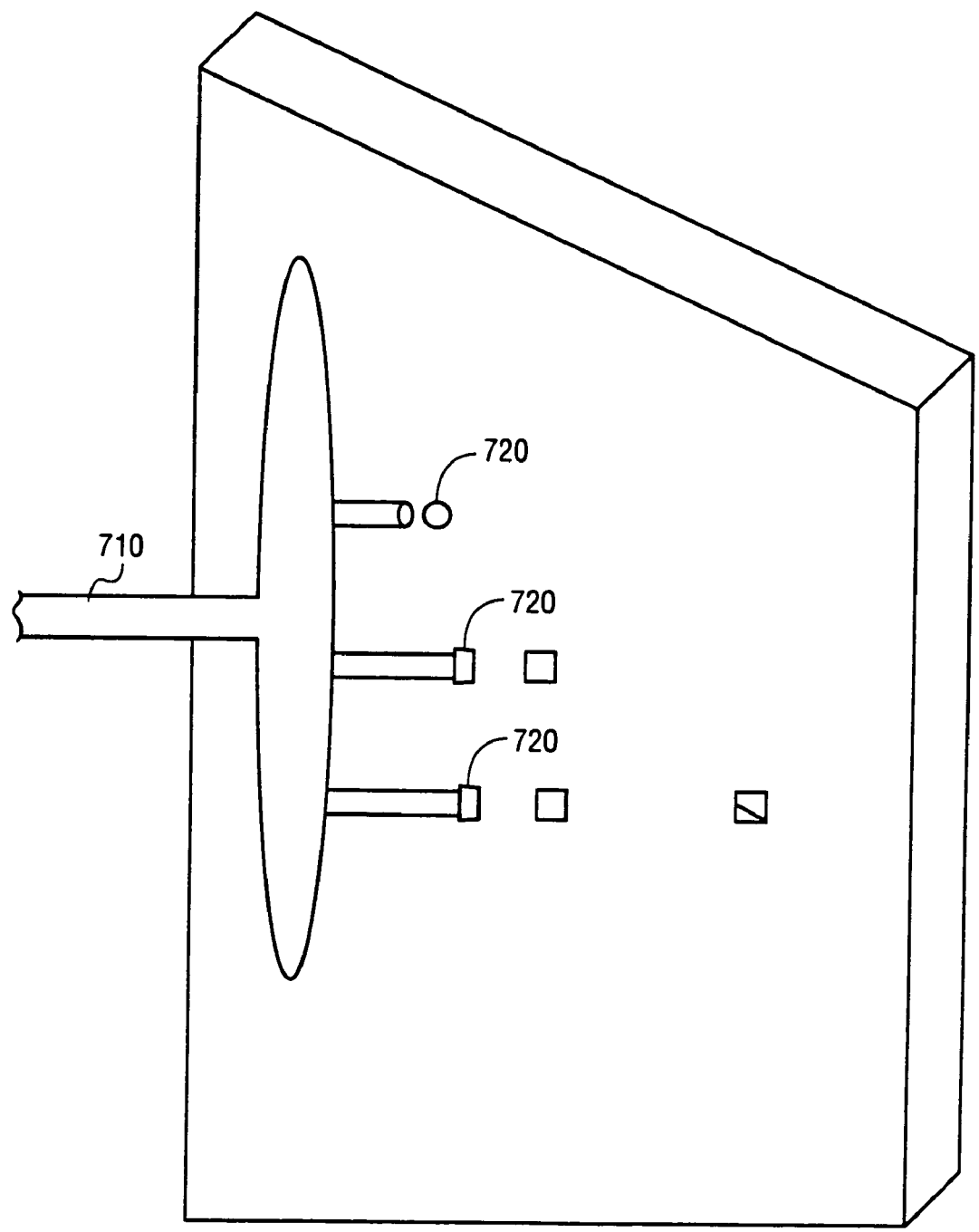
FIG. 32 illustrates a relocating tool near a screen in accordance with one embodiment of the invention.
Figure 33:
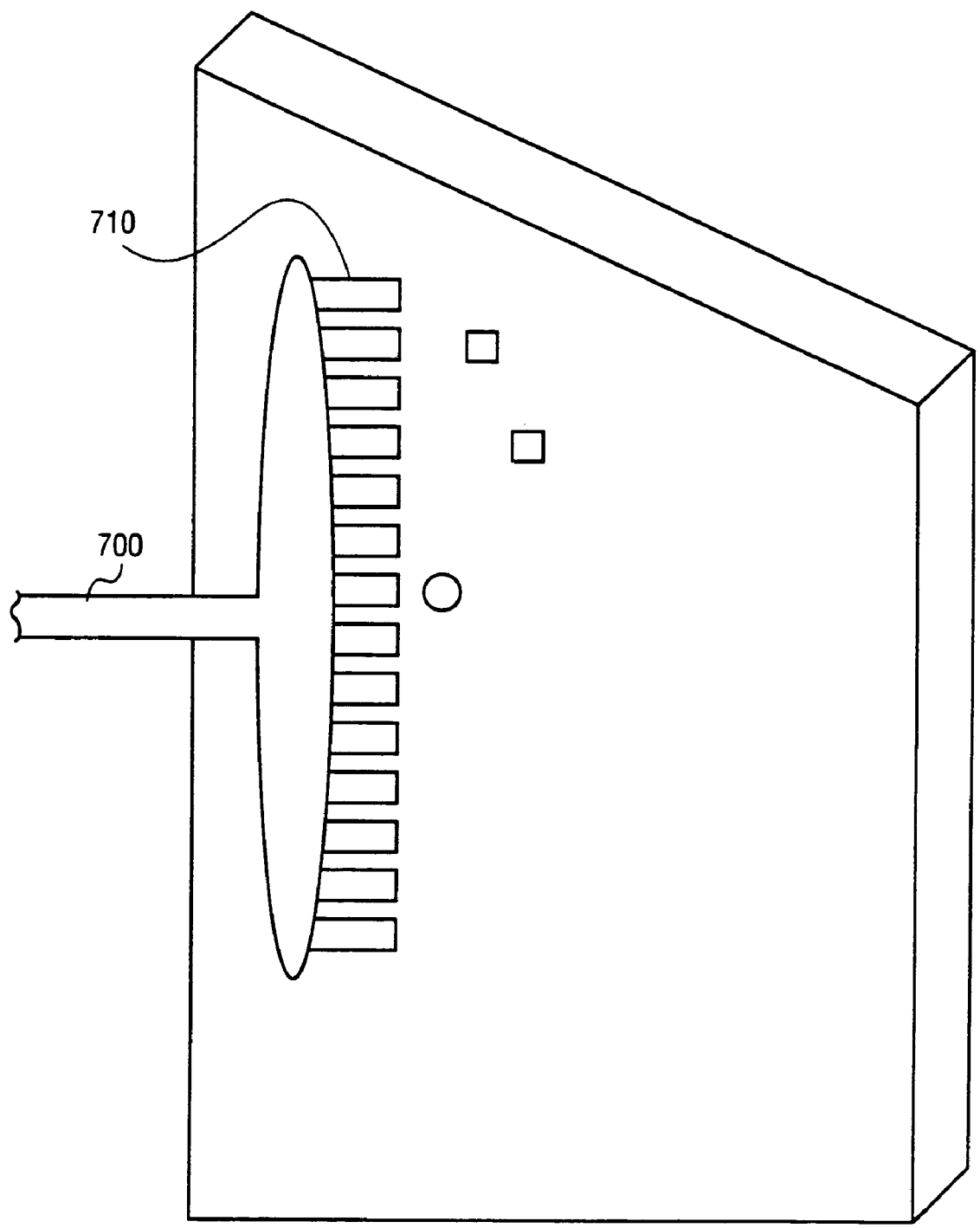
FIG. 33 illustrates a relocating tool near a screen in accordance with one embodiment of the invention.

There are numerous methods for relocating members 710 to hold blocks in place. In one embodiment, relocating members 710 of relocating tool 700 are configured to attract or hold blocks 720 using the bottom surfaces of relocating members 710. For example, relocating tool 700 may use vacuum pressure to attract blocks 720. In this embodiment, relocating members 710 have a generally hollow center (not shown) to allow fluid to enter and pass into the distal tip of the relocating member through relocating tool 700. This fluid that no longer contains blocks then enters a container (not shown) for waste disposal. Once an object such as a block 720 is attracted to a relocating member 710, block 720 generally prevents any more fluid from entering relocating member 710. Vacuum pressure continues to be applied to relocating tool 700 which in turn applies vacuum pressure to the distal tip of relocating member 710. This application of vacuum pressure causes block 720 to be held in place at the distal tip of relocating member 710. When applying vacuum pressure to blocks in a fluid, preferably a screen is used to line up one or more blocks to the distal tips of relocating members 710. The screen could be placed against a few relocating members 710 as illustrated in FIG. 32 or against many relocating members 710 as illustrated in FIG. 33.

In another embodiment, relocating members 710 may be positively charged and blocks 720 may be negatively charged resulting in an electrostatic attraction between relocating members 710 and blocks 720. Alternatively, relocating members 710 may be negatively charged and blocks 720 may be positively charged. By using electrostatic attraction between relocating members 710 and blocks 720, relocating tool 700 holds the blocks in place while transferring the blocks. It will be appreciated that one method of placing a charge on either the blocks or the distal tip of the relocating member is to magnetize the blocks or distal tip of the relocating member using conventional methods.

Figure 34:
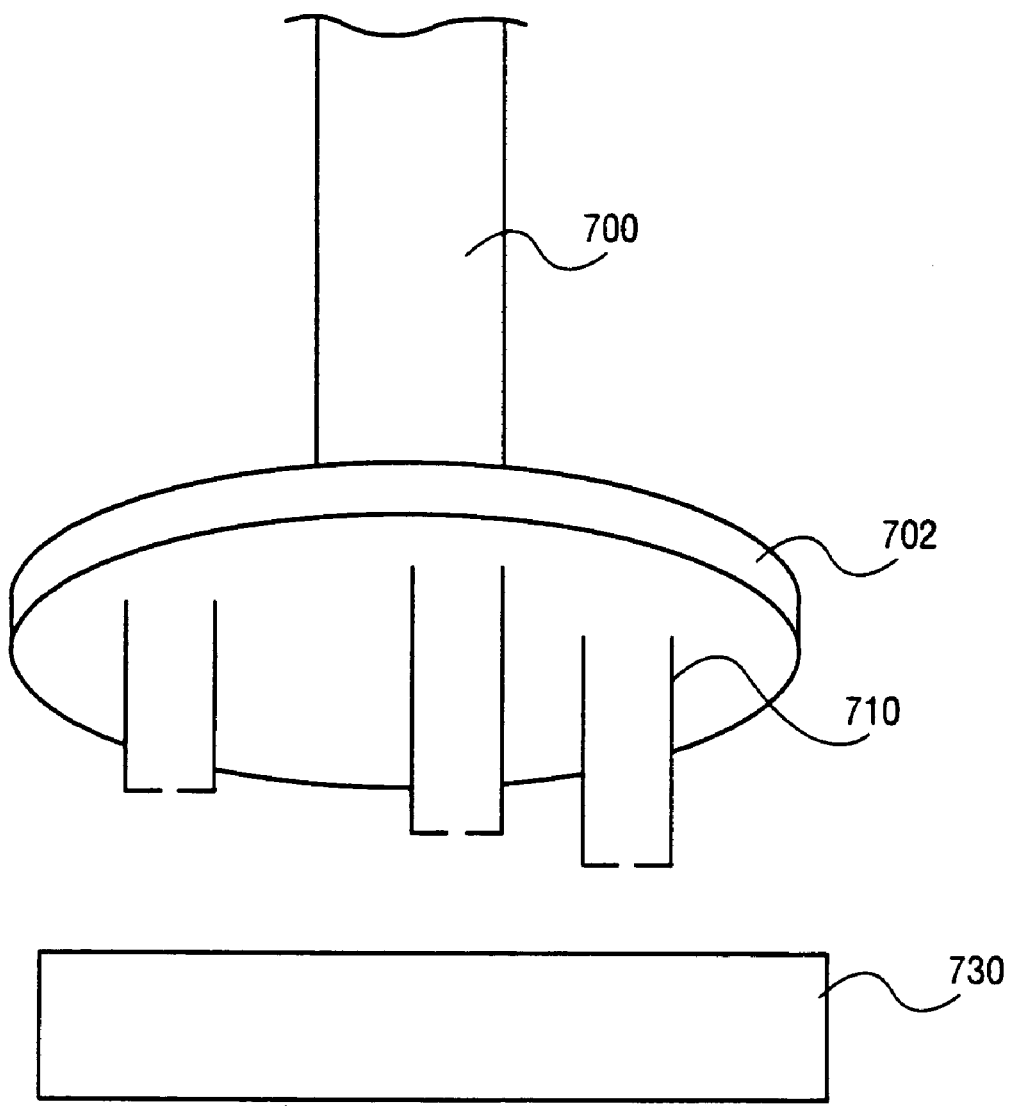
FIG. 34 illustrates a relocating tool in accordance with one embodiment of the invention.
Figure 35:
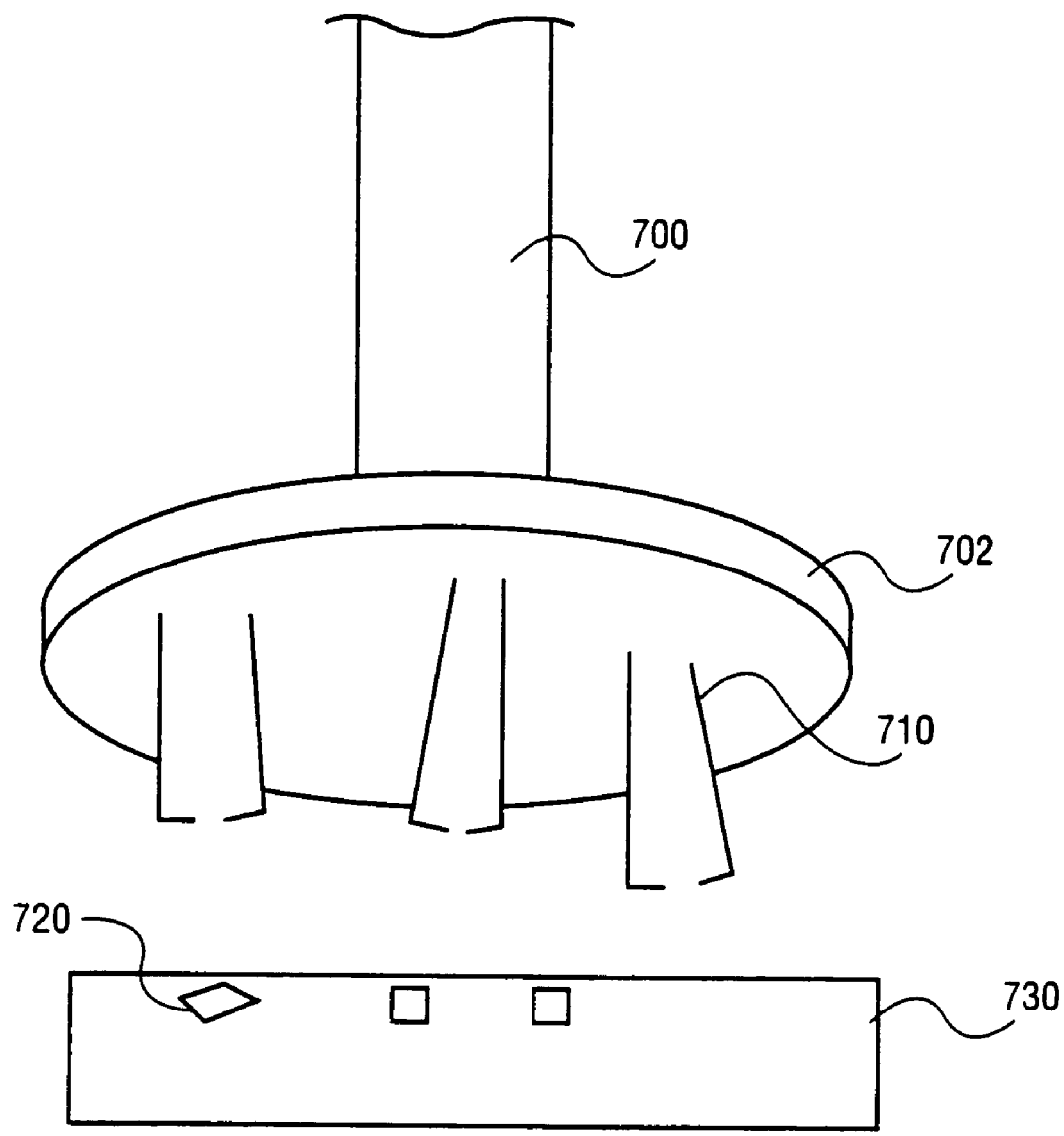
FIG. 35 illustrates a relocating tool in accordance with one embodiment of the invention.

In another embodiment, relocating tool 700 may be configured to use mechanical forces to transfer objects such as blocks. For example, relocating tool 700 may have at least two or more substantially L-shaped fingers or relocating members as illustrated in FIG. 34 that are configured to attach to at least two edges of a block and remove the block from the substrate in which the block is located. As the relocating members approach blocks 720 on a first substrate 730, the L-shaped relocating members spread outwardly and then attach to the blocks as illustrated in FIG. 35. Upon contacting the blocks, the distal ends of the L-shaped relocating members move in an inward direction. In this fashion, L-shaped relocating members may pick up blocks 720 from a first substrate to a second substrate.

Figure 36:
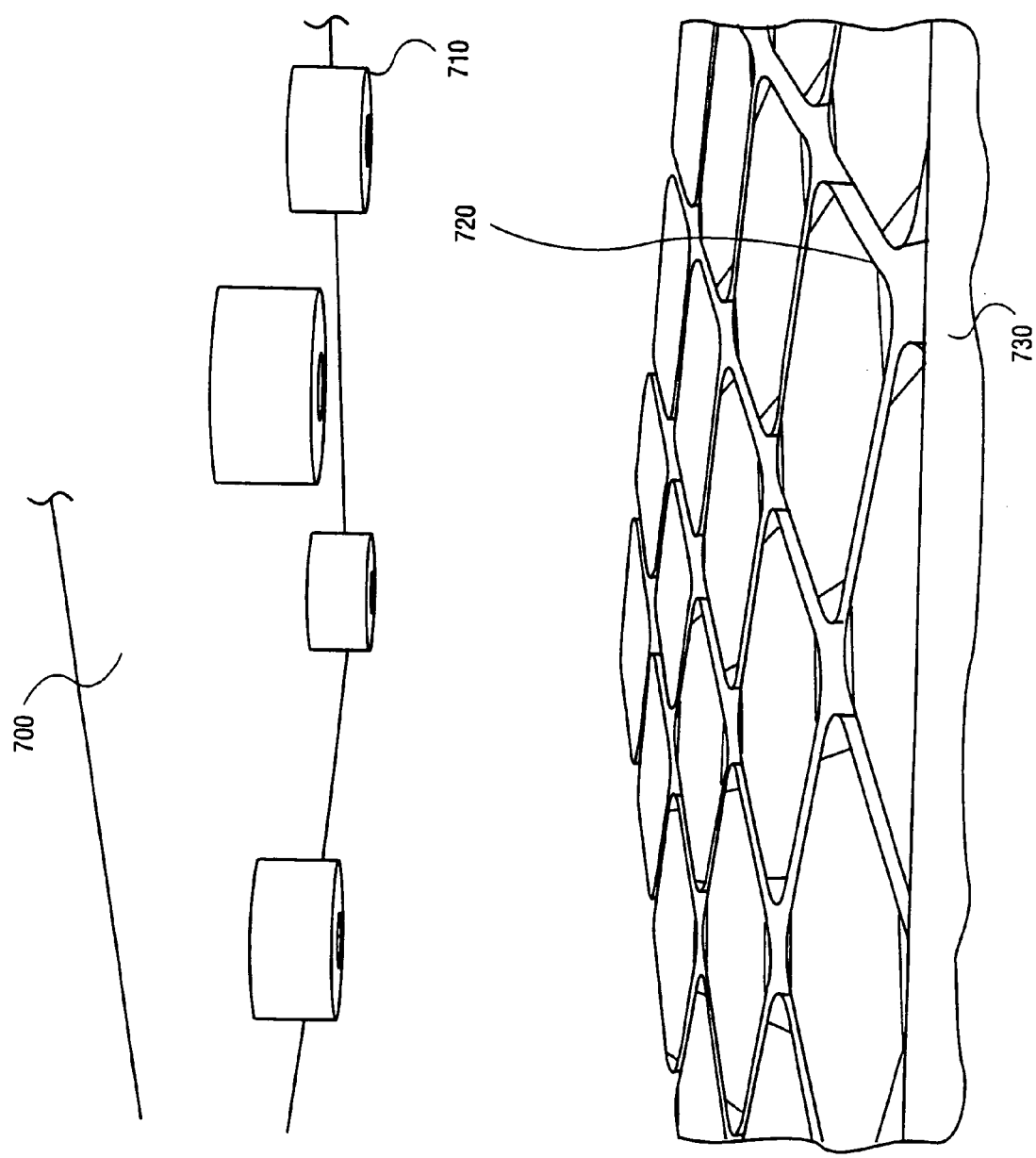
FIG. 36 illustrates a relocating tool approaching a first substrate in accordance with one embodiment of the invention.
Figure 38:
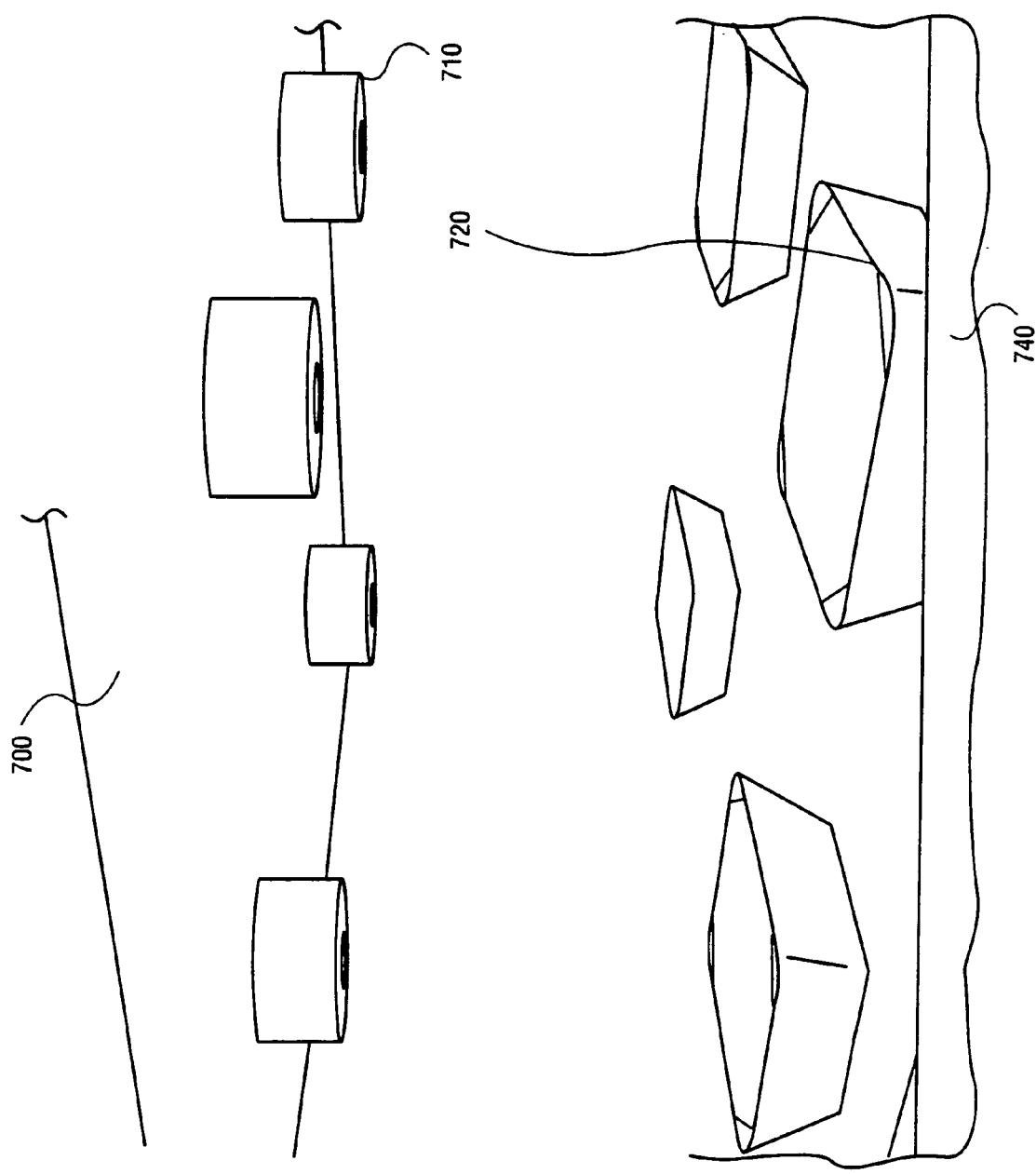
FIG. 38 illustrates blocks transferred to a second substrate in accordance with one embodiment of the invention.

FIG. 36 illustrates a first substrate 730 that has closely packed blocks opposed to relocating tool 700. Relocating tool 700 is used to relocate blocks from the first substrate 730 to a second substrate to produce pixel-wise driving circuits for imaging devices. The blocks are then placed on a second substrate. FIG. 38 shows relocating tool 700 having a plurality of relocating members 710 having distal ends that are substantially circular in shape facing blocks 720.

Figure 37:
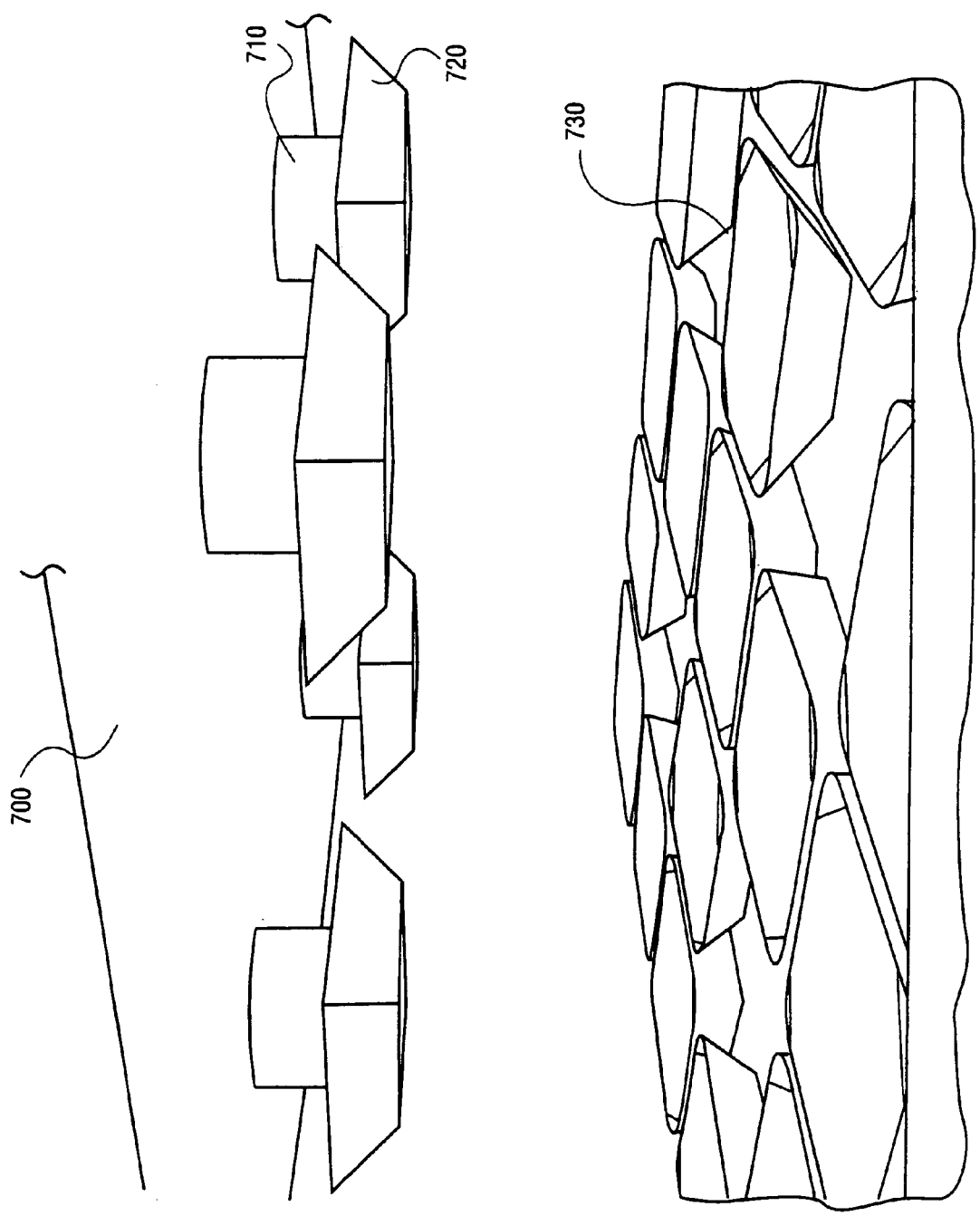
FIG. 37 illustrates a relocating tool transferring blocks to a second substrate in accordance with one embodiment of the invention.

FIG. 37 illustrates relocating tool 710 holding blocks 720 away from first substrate 730. FIG. 38 illustrates relocating tool 710 placing blocks 720 onto a second substrate 740 such as a receiving substrate 720. The transfer of blocks from the first substrate to a second substrate is one operation of forming an electronic assembly such as a display. The blocks may be released from relocating members in a variety of ways. For example, if vacuum pressure is used to hold the blocks to relocating members 710, the seal for the vacuum pressure is broken using conventional means. On the other hand, if electrostatic charge is used, the blocks are place into the recessed regions and released. If mechanical forces are used to hold the blocks in place such as L-shaped relocating members, the distal ends of the L-shaped relocating members are spread in an outward direction and releases the blocks.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also relocating member is to magnetize the blocks or distal tip of the relocating member using conventional methods.

In another embodiment, relocating tool 700 may be configured to use mechanical forces to transfer objects such as blocks. For example, relocating tool 700 may have at least two or more substantially L-shaped fingers or relocating members as illustrated in FIG. 34 that are configured to attach to at least two edges of a block and remove the block from the substrate in which the block is located. As the relocating members approach blocks 720 on a first substrate 730, the L-shaped relocating members spread outwardly and then attach to the blocks as illustrated in FIG. 35. Upon contacting the blocks, the distal ends of the L-shaped relocating members move in an inward direction. In this fashion, L-shaped relocating members may pick up blocks 720 from a first substrate to a second substrate.

FIG. 36 illustrates a first substrate 730 that has closely packed blocks opposed to relocating tool 700. Relocating tool 700 is used to relocate blocks from the first substrate 730 to a second substrate to produce pixel-wise driving circuits for imaging devices. The blocks are then placed on a second substrate. FIG. 38 shows relocating tool 700 having a plurality of relocating members 710 having distal ends that are substantially circular in shape facing blocks 720.

FIG. 37 illustrates relocating tool 710 holding blocks 720 away from first substrate 730. FIG. 38 illustrates relocating tool 710 placing blocks 720 onto a second substrate 740 such as a receiving substrate 720. The transfer of blocks from the first substrate to a second substrate is one operation of forming an electronic assembly such as a display. The blocks may be released from relocating members in a variety of ways. Assignee as the present invention, describes a method of molding substances. This co-pending application is hereby incorporated herein by reference.

U.S. patent application Ser. No. 09/268,755, entitled "*Web Process Interconnect in Electronic Assemblies*", filed by Jeffrey J. Jacobsen, Glenn Wilhelm Gengel, Mark A. Hadley, Gordon S. W. Craig, and John Stephen Smith and assigned to the same Assignee as the present invention, describes a method of creating various interconnects on a web tape. This co-pending application is hereby incorporated herein by reference.

U.S. patent application Ser. No. 09/270,165, entitled "*Apparatuses and Methods for Forming Assemblies*", filed by Jeffrey J. Jacobsen and assigned to the same Assignee as the present invention, describes a method of rolling blocks into their recessed regions. This co-pending application is hereby incorporated herein by reference.

U.S. Pat. No. 5,545,291 entitled "*Method for Fabricating Self-Assembling Microstructures*," filed by John S. Smith and Hsi-Jen J. Yeh, issued Aug. 13, 1996.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method for fabricating an assembly comprising:
performing a Fluidic-Seif Assembly process to deposit a plurality of functional blocks on a first substrate;
attaching the plurality of functional blocks to a relocating tool; and
placing the plurality of functional blocks onto a second substrate by releasing the plurality of functional blocks from the relocating tool.

2. The method of claim 1, wherein the attaching involves one of vacuum pressure, electrostatic charge, and mechanical force.

3. The method of claim 1, wherein the second substrate comprises a plurality of recess regions adapted to receive the plurality of functional blocks.

4. The method of claim 1, wherein the plurality of functional blocks on the first substrate are closely packed.

5. The method of claim 1, wherein the second substrate comprises a flexible material.

6. A method for fabricating an assembly, the method comprising:
providing a plurality of functional blocks on a first substrate;
attaching the plurality of functional blocks to a relocating tool; and
placing the plurality of functional blocks onto a second substrate, wherein the relocating tool has a plurality of relocating members extending therefrom.

7. The method of claim 6, wherein a relocating member of the plurality of relocating members is configured to be selectively moved in a vertical direction.

8. The method of claim 6, wherein a relocating member of the plurality of relocating members has a length ranging from approximately 5 mm to 100 mm.

9. The method of claim 6, wherein the providing is by a fluidic self-assembly process.

10. The method of claim 6, wherein at least one relocating member is configured to receive a functional block.

11. The method of claim 10, wherein at least one relocating member has a distal tip configured in a shape of at least one of a triangle, square, circle, polygon and hexagon.

12. A method for fabricating an assembly comprising:
adjusting a relocating tool to attach at least one functional block thereto, wherein the functional block is placed in a first substrate;
attaching the at least one functional block to the relocating tool, wherein the relocating tool picks the functional block from the first substrate, and
placing the at least one functional block onto a second substrate using the relocating tool.

13. The method of claim 12, wherein the second substrate comprises a flexible material.

14. The method of claim 12 further comprising scanning the second substrate.

15. A method for checking an assembly comprising:
providing a substrate having a plurality of functional blocks;
checking the substrate;
in response to the checking, attaching at least one functional block to a relocating tool, wherein the relocating tool picks the functional block from another substrate; and
placing the at least one functional block onto the substrate by releasing the functional block from the relocating tool.

16. The method of claim 15, wherein the attaching involves one of the vacuum pressure, electrostatic charge, and mechanical force.

17. The method claim 15, wherein the substrate comprises a plurality of recess regions adapted to receive the plurality of functional blocks.

18. The method of claim 15, wherein the plurality of functional blocks on the substrate are closely packed.

19. The method of claim 15, wherein the substrate comprises a flexible material.

20. The method of claim 15, wherein the relocating tool has a plurality of relocating members extending therefrom.

21. The method of claim 20, wherein at least one relocating member has a distal tip configured in a shape of at least one of a triangle, square, circle, polygon and hexagon.

22. The method of claim 20, wherein a relocating member of the plurality of relocating members is configured to be selectively moved in a vertical direction.

23. The method of claim 20, wherein a relocating member of the plurality of relocating members has a length ranging from approximately 5 mm to 100 mm.

* * * * *